(12) United States Patent
Sakurai et al.

(10) Patent No.: US 9,373,595 B2
(45) Date of Patent: Jun. 21, 2016

(54) MOUNTING STRUCTURE AND MANUFACTURING METHOD FOR SAME

(75) Inventors: Daisuke Sakurai, Osaka (JP); Kazuya Usirokawa, Osaka (JP); Kiyomi Hagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/342,935

(22) PCT Filed: Aug. 8, 2012

(86) PCT No.: PCT/JP2012/005026
§ 371 (c)(1),
(2), (4) Date: Mar. 5, 2014

(87) PCT Pub. No.: WO2013/038594
PCT Pub. Date: Mar. 21, 2013

(65) Prior Publication Data
US 2014/0217595 A1  Aug. 7, 2014

(30) Foreign Application Priority Data

Sep. 16, 2011 (JP) ................................. 2011-202496

(51) Int. Cl.
*H01L 23/48* (2006.01)
*H01L 23/52* (2006.01)
(Continued)

(52) U.S. Cl.
CPC .............. *H01L 24/10* (2013.01); *B23K 35/001* (2013.01); *B23K 35/0222* (2013.01); *B23K 35/24* (2013.01); *B23K 35/262* (2013.01); *H01L 24/11* (2013.01); *H01L 24/13* (2013.01);
(Continued)

(58) Field of Classification Search
CPC ............. B23K 35/001; B23K 35/0222; B23K 35/262; B23K 35/24; H01L 24/16; H01L 24/11; H01L 24/13; H01L 24/81
See application file for complete search history.

(56) References Cited

U.S. PATENT DOCUMENTS 6,608,381 B1  8/2003 Akamatsu et al.
6,995,469 B2  2/2006 Hatakeyama
(Continued)

FOREIGN PATENT DOCUMENTS

CN  101156236 A  4/2008
JP  H02-237129  9/1990
(Continued)

OTHER PUBLICATIONS

Office Action issued in corresponding Taiwanese Patent Application No. 101131907, Oct. 22, 2015 (13 pages).
(Continued)

*Primary Examiner* — Jarrett Stark
(74) *Attorney, Agent, or Firm* — Hamre, Schumann, Mueller & Larson, P.C.

(57) ABSTRACT

In a provided mounting structure, an electronic component such as a semiconductor chip having a fragile film is mounted on a substrate such as a circuit board with higher connection reliability. A junction that connects an electrode terminal (4) of an electronic component (1) and an electrode terminal (5) of a substrate (2) contains an alloy (8) and a metal (9) having a lower modulus of elasticity than the alloy (8). The junction has a cross section structure in which the alloy (8) is surrounded by the metal (9) having the lower modulus of elasticity.

16 Claims, 15 Drawing Sheets

(51) Int. Cl.
*H01L 29/40* (2006.01)
*H01L 23/00* (2006.01)
*B23K 35/24* (2006.01)
*B23K 35/26* (2006.01)
*B23K 35/00* (2006.01)
*B23K 35/02* (2006.01)

(52) U.S. Cl.
CPC ............... *H01L 24/16* (2013.01); *H01L 24/81* (2013.01); *B23K 2201/40* (2013.01); *H01L 2224/0401* (2013.01); *H01L 2224/05541* (2013.01); *H01L 2224/05557* (2013.01); *H01L 2224/1144* (2013.01); *H01L 2224/1182* (2013.01); *H01L 2224/11464* (2013.01); *H01L 2224/13082* (2013.01); *H01L 2224/13144* (2013.01); *H01L 2224/13155* (2013.01); *H01L 2224/13553* (2013.01); *H01L 2224/13562* (2013.01); *H01L 2224/13582* (2013.01); *H01L 2224/13611* (2013.01); *H01L 2224/13655* (2013.01); *H01L 2224/16225* (2013.01); *H01L 2224/16227* (2013.01); *H01L 2224/16501* (2013.01); *H01L 2224/8121* (2013.01); *H01L 2224/81075* (2013.01); *H01L 2224/81191* (2013.01); *H01L 2224/81193* (2013.01); *H01L 2224/81203* (2013.01); *H01L 2224/81805* (2013.01); *H01L 2224/81825* (2013.01); *H01L 2924/181* (2013.01); *H01L 2924/3511* (2013.01); *H01L 2924/381* (2013.01)

(56) References Cited

U.S. PATENT DOCUMENTS

| | | | |
|---|---|---|---|
| 7,598,613 | B2 | 10/2009 | Tanida et al. |
| 7,772,032 | B2 | 8/2010 | Kurita |
| 8,283,246 | B2 | 10/2012 | Kitae et al. |
| 2006/0017171 | A1* | 1/2006 | Weng .............................. 257/766 |
| 2008/0237314 | A1* | 10/2008 | Yu et al. ......................... 228/245 |
| 2008/0265006 | A1* | 10/2008 | Yu et al. ......................... 228/203 |
| 2009/0297879 | A1* | 12/2009 | Zeng ....................... H01L 24/05 428/647 |
| 2011/0012263 | A1 | 1/2011 | Hata et al. |
| 2011/0285015 | A1* | 11/2011 | Song et al. ..................... 257/737 |
| 2014/0054766 | A1* | 2/2014 | Hashino et al. ............... 257/737 |

FOREIGN PATENT DOCUMENTS

| | | |
|---|---|---|
| JP | H09-097791 | 4/1997 |
| JP | H10-303548 | 11/1998 |
| JP | 2002-280407 | 9/2002 |
| JP | 2003-282617 | 10/2003 |
| JP | 2006-156492 | 6/2006 |

OTHER PUBLICATIONS

Office Action issued in counterpart Chinese Patent Application No. 201280038204.3 on Nov. 13, 2015 (9 pages) and English translation of search report.

\* cited by examiner

MOUNTING STRUCTURE AND MANUFACTURING METHOD FOR SAME

TECHNICAL FIELD

The present invention relates to a mounting structure including an electronic component, e.g., a semiconductor chip mounted on a substrate such as a circuit board, and a manufacturing method for the same.

BACKGROUND ART

A mounting structure manufactured by the flip chip method includes a semiconductor chip, e.g., an LSI chip mounted on a circuit board. In the flip chip method, protruding electrodes (bumps) such as solder bumps are formed on the electrode terminals (electrode pads) of a semiconductor chip, and then the semiconductor chip is mounted face down on a circuit board. Specifically, in a flip-chip process, the electrode terminals of the semiconductor chip are aligned with the electrode terminals of the circuit board, and then the protruding electrodes on the heated semiconductor chip are pressed to the electrode terminals of the circuit board.

Generally, solder bumps are formed as follows: solder is fed onto the electrode terminals of a semiconductor chip by screen printing, a dispenser, or electrolytic plating, and then the semiconductor chip is heated at least to the melting point of solder in a reflow furnace. If the protruding electrodes are solder bumps, a clearance between the semiconductor chip and the circuit board is filled with molding resin to enhance bonding strength between the electrode terminals of the semiconductor chip and the electrode terminals of the circuit board.

In addition to solder bumps, protruding electrodes made of gold or copper are available. Protruding electrodes made of gold or copper are generally formed by electrolytic plating. In the case of protruding electrodes made of gold or copper, generally, an anisotropic conductive film with an adhesive containing metallic particles is temporarily bonded onto a circuit board, and then a semiconductor chip is bonded face down onto the circuit board via the anisotropic conductive film by thermocompression bonding.

In order to increase the number of pins with higher densities on semiconductor chips, the pitches of electrode terminals on semiconductor chips have been reduced with a smaller area. The pitches of electrode terminals, in particular, have been considerably reduced. Thus, in the case of conventional electrode terminals arranged in a row or staggered in two rows on the outer periphery of a semiconductor chip, a short circuit may occur between the adjacent electrode terminals or faulty connection may occur due to a thermal stress resulting from a difference in thermal expansion coefficient between a semiconductor chip and a circuit board.

Specifically, if the protruding electrodes are solder bumps, a so-called faulty bridge may occur, leading to a short circuit between the adjacent electrode terminals. Such a faulty bridge occurs when molten solder is deformed to connect the adjacent solder bumps with a surface tension of solder in a flip-chip process. Hence, as the pitches of electrode terminals of semiconductor chips decrease, faulty connections are more likely to occur. Moreover, a faulty connection, which is caused by a thermal stress resulting from a difference in thermal expansion coefficient between a semiconductor chip and a circuit board, appears because the narrow pitches of the electrode terminals of the semiconductor chip prevent molding resin in a clearance between the semiconductor chip and the circuit board from filling all gaps between solder bumps placed on the outer periphery of the semiconductor chip.

In the case of protruding electrodes made of gold or copper, as the pitches of electrode terminals of a semiconductor chip decrease, metallic particles dispersed in an anisotropic conductive film may join to one another between the adjacent protruding electrodes and cause a short circuit between the adjacent electrode terminals. Moreover, a faulty connection, which is caused by a thermal stress resulting from a difference in thermal expansion coefficient between the semiconductor chip and a circuit board, appears because the narrow pitches of the electrode terminals of the semiconductor chip prevent the anisotropic conductive film from filling all gaps between the protruding electrodes placed on the outer periphery of the semiconductor chip.

As has been discussed, as the pitches of electrode terminals of a semiconductor chip decrease, a short circuit may occur between the adjacent electrode terminals or faulty connection may occur due to a thermal stress resulting from a difference in thermal expansion coefficient between the semiconductor chip and a circuit board. Hence, in order to increase the pitches between the electrode terminals, the electrode terminals are disposed over the area of the major surface (element surface) of the semiconductor chip (for example, being spaced in a lattice pattern).

However, in recent years, even electrode terminals disposed over the area of the major surface of a semiconductor chip have considerably decreased in pitch, leading to a short circuit between the electrode terminals. In order to solve this problem, protruding electrodes with cylindrical surfaces are proposed (for example, see Patent literature 1). The cylindrical surface made of gold or copper is covered with an insulating coating containing metallic particles. When the protruding electrodes covered with the insulating coatings are pressed into contact with the electrode terminals of a circuit board, the insulating coatings are compressed such that metallic particles penetrate the insulating coatings into contact with the electrode terminals of the circuit board. This ensures electrical connection between the cylindrical electrodes and the electrode terminals of the circuit board. Moreover, the metallic particles do not join to one another between the adjacent protruding electrodes, preventing a short circuit between the adjacent electrode terminals.

In a mounting structure described in Patent Literature 1, however, metallic particles only come into contact with the cylindrical electrodes on a semiconductor chip and the electrode terminals of the circuit board without diffused junction. Thus, if the electrode terminals of the semiconductor chip decrease in area, the number of metallic particles decreases between the cylindrical electrodes and the electrode terminals of the circuit board. This increases connection resistance between the electrode terminals of the semiconductor chip and the electrode terminals of the circuit board. In recent years, narrower pitches and smaller areas have been seriously demanded of the electrode terminals of semiconductor chips. Thus, in the mounting structure described in Patent Literature 1, if the electrode terminals of the semiconductor chip have areas as has been recently demanded, connection resistance disadvantageously increases between the electrode terminals of the semiconductor chip and the electrode terminals of the circuit board. The increased connection resistance may increase the transmission loss of a signal transmitted between the electrode terminals of the semiconductor chip and the electrode terminals of the circuit board.

Additionally, protruding electrodes having upper electrodes of solder are proposed (for example, see Patent Literature 2). The upper electrodes are disposed on refractory lower electrodes that do not melt in a flip-chip process. The protruding electrode having a two-layer structure has a smaller amount of solder than a solder bump that is only composed of solder. This reduces the amount of solder spilling in a plane in the flip chip process, thereby reducing the occurrence of faulty bridges. Moreover, the solder of the upper electrodes makes diffused junctions with the lower electrodes and the electrode terminals of a circuit board, reducing connection resistance between the electrode terminals of a semiconductor chip and the electrode terminals of the circuit board without increasing the transmission loss of a signal transmitted between the electrode terminals of the semiconductor chip and the electrode terminals of the circuit board.

CITATION LIST

Patent Literature

Patent Literature 1: Japanese Patent Laid-Open No. 2003-282617
Patent Literature 2: Japanese Patent Laid-Open No. 9-97791

SUMMARY OF INVENTION

Technical Problem

In recent years, however, wiring rules of finer designs and faster signal processing have been increasingly demanded. In response to these demands, low dielectric constant insulating films such as a low-k film and an ultra low-k film have been used as interlayer insulating films for semiconductor chips. A low dielectric constant insulating film is a porous film having multiple pores having an opening size of several nm, and has a density of, for example, about $1.0 \text{ g/cm}^3$ to $1.4 \text{ g/cm}^3$. Since such a dielectric constant insulating film is fragile, as described in Patent Literature 2, even the protruding electrode including the upper solder electrode of solder on the top of the refractory lower electrode has been found to have drawbacks as follows:

FIG. 16 is a cross-sectional view for explaining a mounting structure in the conventional semiconductor device described in Patent Literature 2.

As shown in FIG. 16, protruding electrodes 102 are formed on the electrode terminals (not shown) of a semiconductor chip 101. The protruding electrode 102 includes a solder upper electrode 102b formed on a refractory lower electrode 102a that does not melt in a flip chip process.

The semiconductor chip 101 having the protruding electrodes 102 with a two-layer structure is mounted on a circuit board 103 by the flip chip method. Specifically, the electrode terminals (not shown) of the semiconductor chip 101 are aligned with electrode terminals 104 of the circuit board 103, and then the protruding electrodes 102 on the heated semiconductor chip 101 are pressed to the electrode terminals 104 of the circuit board 103. Thus, the upper electrodes 102b are melted. Solder 102b of the melted upper electrodes 102b makes diffused junctions with the lower electrodes 102a and the electrode terminals 104 of the circuit board 103.

However, the protruding electrode described in Patent Literature 2 has the solder upper electrode 102b on the top of the cylindrical lower electrode 102a, and thus while the molten solder 102b' is cooled to room temperature, a thermal stress caused by a difference in modulus of elasticity and a difference in linear expansion coefficient between the semiconductor chip 101 and the circuit board 103 concentrates on the solder 102b' disposed on the outer periphery of the semiconductor chip 101 having a rectangular outside shape. When the solder 102b' having the concentrated thermal stress is extended, the area of the solder 102b' covering the lower electrode 102a disposed on the outer periphery of the semiconductor chip 1 decreases. Thus, if the lower electrode 102a is made of a metal having a high modulus of elasticity, e.g., Ni(nickel), the area of the solder 102' covering the lower electrode 102a having a higher modulus of elasticity than solder decreases while the molten solder 102b' is cooled to room temperature, and then the thermal stress concentrating on the molten solder 102b' is directly transmitted to a layer immediately under the lower electrode 102a through the lower electrode 102a made of a metal having a high modulus of elasticity, on the outer periphery of the semiconductor chip 101. For this reason, if the interlayer insulating film of the semiconductor chip 101 is a fragile insulating film having a low dielectric constant, the interlayer insulating film has at least exfoliation or a crack on the outer periphery of the semiconductor chip 101. This problem is likely to occur particularly around the corners of the rectangular semiconductor chip 101, the corners being most likely to be curved.

Also when the semiconductor device is actually used under a sharp temperature difference, a thermal stress concentrates on the solder 102b' disposed on the outer periphery of the semiconductor chip 101. Since the area of the solder 102b covering the lower electrode 102a decreases, on the outer periphery of the semiconductor chip 1, a junction connecting the electrode terminal (not shown) of the semiconductor chip 101 and the electrode terminal 104 of the circuit board 103 increases in modulus of elasticity. Thus, also in the actual use of the semiconductor device, the fragile insulating film with a low dielectric constant may have at least exfoliation or a crack on the outer periphery (especially at the corners) of the semiconductor chip 101.

In the mounting structure described in Patent Literature 2, the height of the lower electrode 102a having a high modulus of elasticity is reduced and the height of the solder upper electrode 102b is increased such that a smaller thermal stress is transmitted to the layer immediately under the lower electrode 102a disposed on the outer periphery of the semiconductor chip 101. Thus, in the actual use of the semiconductor device, unfortunately, an electromigration phenomenon that transfers atoms along a flow of electrons may change the connection resistance of the junction that connects the electrode terminal (not shown) of the semiconductor chip 101 and the electrode terminal 104 of the circuit board 103. For example, if the lower electrode 102a is made of Ni, the upper electrode 102b is made of Sn—Ag(tin-silver) solder, the lower electrode 102a acts as a cathode, and the electrode terminal 104 of the circuit board 103 acts as an anode, Ni atoms contained in the lower electrode 102a acting as a cathode move to the anode that is the electrode terminal 104 of the circuit board 103, and then a $Ni_3Sn_4$ alloy layer is grown from the interface between the lower electrode 102a and the solder 102b'. Hence, when a high current is applied to the junction for a long period of time, the electromigration phenomenon may cause voids in the lower electrode 102a that constitutes the junction, thereby changing the connection resistance of the junction.

An object of the present invention is to provide a mounting structure, in which an electronic component, e.g., a semiconductor chip with a fragile film is mounted on a substrate, e.g., a circuit board, with higher connection reliability and a manufacturing method for the same.

Solution to Problem

An aspect of a mounting structure of the present invention includes: an electronic component having a plurality of first electrode terminals; a substrate having a plurality of second electrode terminals; and junctions each of which contains an alloy and a metal having a lower modulus of elasticity than the alloy, has a cross section structure containing the alloy surrounded by the metal having the lower modulus of elasticity, and connects the first electrode terminal and the second electrode terminal.

Another aspect of the mounting structure of the present invention, wherein at least one of the junctions has a portion connecting an alloy grown from the first electrode terminal and an alloy grown from the second electrode terminal, and the connecting portion contains an alloy surrounded by the metal having the lower modulus of elasticity.

Another aspect of the mounting structure of the present invention, wherein on a cross section where the ratio of the metal having the lower modulus of elasticity is maximized in at least one of the junctions disposed on the outer periphery of the electronic component, the ratio of the metal having the lower modulus of elasticity is higher than the ratio of the metal having the lower modulus of elasticity on a cross section where the ratio of the metal having the lower modulus of elasticity is maximized in at least one of the junctions disposed at the center of the electronic component.

Another aspect of the mounting structure of the present invention, wherein the junction includes a first junction and a second junction, and if the first junction has a current value larger than the current value of the second junction per unit time, the content of the metal having the lower modulus of elasticity in the first junction is smaller than the content of the metal having the lower modulus of elasticity in the second junction.

Another aspect of the mounting structure of the present invention, wherein the junction contains a first protruding electrode that is provided on the first electrode terminal of the electronic component and has a curvature on the edge of the first protruding electrode.

Another aspect of the mounting structure of the present invention, wherein the junction contains a first protruding electrode that is provided on the first electrode terminal of the electronic component and has a curvature on the edge of the first protruding electrode, and one of a second protruding electrode having a curvature on the edge of the second protruding electrode, a flat electrode, and a cylindrical electrode that are provided on the second electrode terminal of the substrate.

Another aspect of the mounting structure of the present invention, wherein the metal having the lower modulus of elasticity is solder.

Another aspect of the mounting structure of the present invention, wherein the alloy contains a nickel-tin alloy, and the metal having the lower modulus of elasticity contains tin.

Another aspect of the mounting structure of the present invention, wherein the first protruding electrode contains nickel, the alloy contains a nickel-tin alloy, and the metal having the lower modulus of elasticity contains tin.

Another aspect of the mounting structure of the present invention, wherein the first protruding electrode contains nickel, one of the second protruding electrode and the flat electrode contains nickel, the alloy contains a nickel-tin alloy, and the metal having the lower modulus of elasticity contains tin.

Another aspect of the mounting structure of the present invention, wherein the first protruding electrode contains nickel, the cylindrical electrode contains copper, the alloy contains a nickel-tin alloy, a tin-copper alloy, and a nickel-tin-copper alloy, and the metal having the lower modulus of elasticity contains tin.

Another aspect of the mounting structure of the present invention, wherein the alloy has fine irregularities on the surface of the alloy.

An aspect of a first manufacturing method for a mounting structure of the present invention is a manufacturing method for a mounting structure in which an electronic component having a plurality of first electrode terminals is mounted on a substrate having a plurality of second electrode terminals, the manufacturing method including: growing a first alloy composed of a metal constituting a first protruding electrode and a metal constituting solder and a second alloy composed of a metal constituting a second protruding electrode and the metal constituting the solder, by melting the solder for joining the first protruding electrode having a curvature on the edge of the first protruding electrode on the first electrode terminal and the second protruding electrode having a curvature on the edge of the second protruding electrode on the second electrode terminal; and cooling the solder so as to form junctions each of which has a cross section structure containing the first and second alloys surrounded by the solder having a lower modulus of elasticity than the first and second alloys and connects the first electrode terminal and the second electrode terminal.

Another aspect of the first manufacturing method for the mounting structure of the present invention is that the first alloy and the second alloy are grown so as to be connected to each other in the melting of the solder.

Another aspect of the first manufacturing method for the mounting structure of the present invention further includes applying a current to predetermined one of the junctions so as to grow the first and second alloys in the predetermined junction after cooling the solder.

An aspect of a second manufacturing method for a mounting structure of the present invention is a manufacturing method for a mounting structure in which an electronic component having a plurality of first electrode terminals is mounted on a substrate having a plurality of second electrode terminals, the manufacturing method includes: growing a first alloy composed of a metal constituting a protruding electrode and a metal constituting solder and a second alloy composed of a metal constituting a flat electrode and the metal constituting the solder, by melting the solder for joining the protruding electrode having a curvature on the edge of the protruding electrode on the first electrode terminal and the flat electrode provided on the second electrode terminal; and cooling the solder so as to form junctions each of which has a cross section structure containing the first and second alloys surrounded by the solder having a lower modulus of elasticity than the first and second alloys and connects the first electrode terminal and the second electrode terminal.

Another aspect of the second manufacturing method for the mounting structure of the present invention is that the first alloy and the second alloy are grown so as to be connected to each other in the melting of the solder.

Another aspect of the second manufacturing method for the mounting structure of the present invention further includes applying a current to predetermined one of the junctions so as to grow the first and second alloys in the predetermined junction after cooling the solder.

An aspect of a third manufacturing method for a mounting structure of the present invention is a manufacturing method for a mounting structure in which an electronic component having a plurality of first electrode terminals is mounted on a substrate having a plurality of second electrode terminals, the manufacturing method including: growing a first alloy composed of a metal constituting a protruding electrode and a metal constituting solder, a second alloy composed of a metal constituting a cylindrical electrode and the metal constituting the solder, and a third alloy composed of the metal constituting the protruding electrode, the metal constituting the solder, and the metal constituting the cylindrical electrode, by melting the solder for joining the protruding electrode having a curvature on the edge of the protruding electrode on the first electrode terminal and the cylindrical electrode provided on the second electrode terminal; and cooling the solder so as to form junctions each of which has a cross section structure containing the first to third alloys surrounded by the solder having a lower modulus of elasticity than the first to third alloys and connects the first electrode terminal and the second electrode terminal, wherein the metal constituting the cylindrical electrode has a lower modulus of elasticity than the metal constituting the protruding electrode.

Another aspect of the third manufacturing method for the mounting structure of the present invention is that the first alloy, the second alloy, and the third alloy are grown so as to connect the first alloy and the second alloy and grow the third alloy from the interface between the first alloy and the second alloy in the melting of the solder.

Another aspect of the third manufacturing method for the mounting structure of the present invention further includes applying a current to predetermined one of the junctions so as to grow the first to third alloys in the predetermined junction after cooling the solder.

Another aspect of the first to third manufacturing methods for the mounting structure of the present invention further includes reducing pressures against the electronic component and the substrate such that on a cross section where the ratio of the solder is maximized in at least one of the junctions disposed on the outer periphery of the electronic component in the melting of the solder, the ratio of the solder is higher than the ratio of the solder on a cross section where the ratio of the solder is maximized in at least one of the junctions disposed at the center of the electronic component.

Advantageous Effects of Invention

According to the present invention, a junction connecting the electrode terminal of an electronic component and the electrode terminal of a substrate has a cross section structure containing an alloy surrounded by a metal having a lower modulus of elasticity than the alloy. Thus, the metal having the lower modulus of elasticity reduces a stress concentration in a shearing direction on the electrode terminal of the electronic component. This reduces a stress applied to a fragile film disposed immediately under the electrode terminal of the electronic component, thereby preventing exfoliation and a crack on the fragile film. Thus, a mounting structure can be obtained with higher connection reliability.

According to another aspect of the present invention, an alloy grown from the electrode terminal of the electronic component and an alloy grown from the electrode terminal of the substrate are connected to each other, allowing the passage of a current through the connected alloys. This suppresses the growth of the alloys that is caused by an electromigration phenomenon. Thus, fluctuations in the connection resistance of the junction can be reduced.

DESCRIPTION OF EMBODIMENTS

Figure 1:
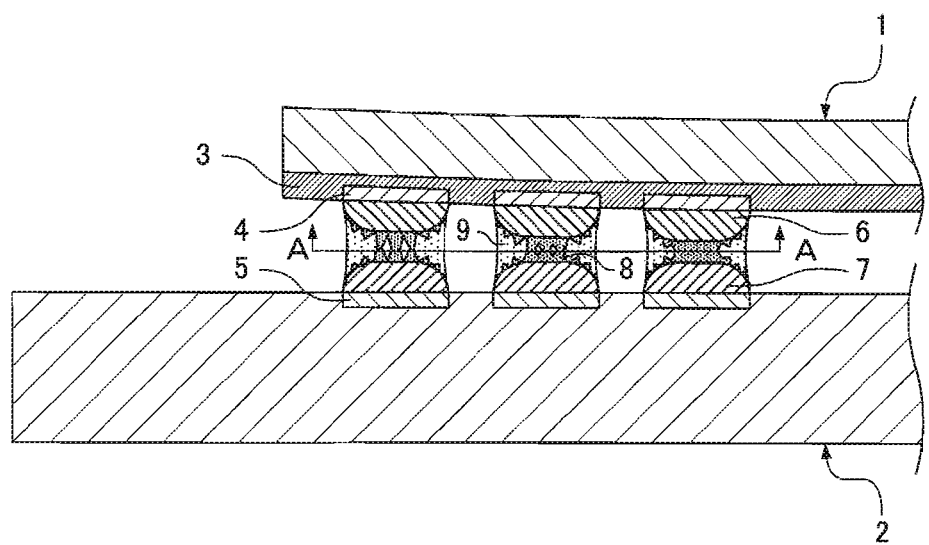
FIG. 1 is a cross-sectional view for explaining a mounting structure according to a first embodiment.

Embodiments of the present invention will be described below with reference to the accompanying drawings. The same constituent elements are indicated by the same reference numerals and the explanation thereof is optionally omitted. For the sake of explanation, the drawings to be referred to in the following explanation schematically show only necessary ones of the constituent elements for explaining the embodiments of the present invention. To enhance understanding, the constituent elements are schematically or conceptually shown in the drawings. The illustrated constituent elements are different from actual ones in shape, thickness, length, and number for the creation of the drawings. The materials, shapes, and dimensions of the constituent elements in the following embodiments are merely exemplary and are not particularly limited. Hence, the constituent elements can be changed in various ways without substantially departing from the effect of the present invention. The materials of the constituent elements in the following embodiments are main components.

In the following embodiments, for example, semiconductor chips made of Si(silicon) or GaAs (gallium arsenide) are illustrated as electronic components. Moreover, a circuit board is illustrated as a substrate having electronic components. Thus, in the following embodiments, a mounting structure in a semiconductor device will be illustrated below. However, the electronic component and the substrate are not limited. For example, the same effect as in the following embodiments can be obtained by, for example, electronic components including a capacitor with a small pitch between electrode terminals and a passive component such as a coil and a resistor.

First Embodiment

FIG. 1 is a cross-sectional view for explaining a mounting structure according to a first embodiment.

As shown in FIG. 1, the inner layer of a semiconductor chip 1 has a multiple-wiring layer that faces a circuit board 2. The multiple-wiring layer includes a fine wiring layer (not shown) made of materials such as Cu (copper) and Al (aluminum) and a fragile low-dielectric constant insulating layer (an example of an interlayer insulating film) 3, e.g., a low-k layer or an ultra low-k layer. A plurality of electrode terminals (electrode pads) 4 are disposed over the entire area of the outermost surface of the multiple-wiring layer. In the first embodiment, the low-dielectric constant insulating layer 3 has a thickness of several hundreds of nm per layer. The electrode terminals 4 of the semiconductor chip 1 are composed of, for example, aluminum alloys such as Al—Cu, Al—Si—Cu, and Al—Si alloys, Cu, and Al. In the first embodiment, Al is selected as a material of the electrode terminals 4.

The circuit board 2 has electrode terminals (electrodes pads) 5 that are opposed to the electrode terminals 4 of the semiconductor chip 1. The circuit board 2 may be made of a base material, for example, silicon, polysilicon, or glass. The electrode terminals 5 of the circuit board 2 are composed of, for example, aluminum alloys such as Al—Cu, Al—Si—Cu, and Al—Si alloys, Cu, and Al. In the first embodiment, Al is selected as a material of the electrode terminals 5.

A protruding electrode (bump) 6 that is a dome with a flat portion is provided on each of the electrode terminals 4 of the semiconductor chip 1. The protruding electrode 6 is an example of a shape having a curvature on the edge. Similarly, a protruding electrode 7 that is a dome with a flat portion is provided on each of the electrode terminals 5 of the circuit board 2. The protruding electrode 7 is an example of a shape having a curvature on the edge. The electrode terminals 4 of the semiconductor chip 1 and the electrode terminals 5 of the circuit board 2 are electrically and mechanically connected to each other via the protruding electrodes 6 and 7, which are provided on the electrode terminals 4 and 5, an alloy layer 8, and solder 9 that is an example of a metal having a lower modulus of elasticity than the protruding electrodes 6 and 7 and the alloy layer 8. Thus, a junction connecting the electrode terminal 4 of the semiconductor chip 1 and the electrode terminal 5 of the circuit board 2 is composed of the protruding electrodes 6 and 7, the alloy layer 8, and the solder 9.

The protruding electrodes 6 and 7 are composed of, for example, a Ni—P(phosphorus) alloy, a Ni—B(boron) alloy, and Ni. Alternatively, the protruding electrodes 6 and 7 may have a three-layer structure made of, for example, Ni/Pd (palladium)/Au(gold). The solder 9 may be, for example, Sn—Ag solder, Sn—Ag—Cu solder, Sn—Zn(zinc) solder, Sn—Zn—Bi(bismuth) solder, Sn—Pb(lead) solder, Sn—Bi solder, Sn—Ag—Bi—In(indium) solder, Sn—In solder, In solder, or Sn solder. The alloy layer 8 is made of, for example, $Ni_3Sn_4$, $Ni_3Sn_2$, $Ni_3Sn$, and $Ni_3SnP$. In the first embodiment, the principal component of the protruding electrodes 6 and 7 is Ni, the principal component of the solder 9 is Sn, and the alloy layer 8 is composed of a Ni—Sn alloy (nickel-tin alloy), e.g., $Ni_3Sn_4$.

Figure 2:
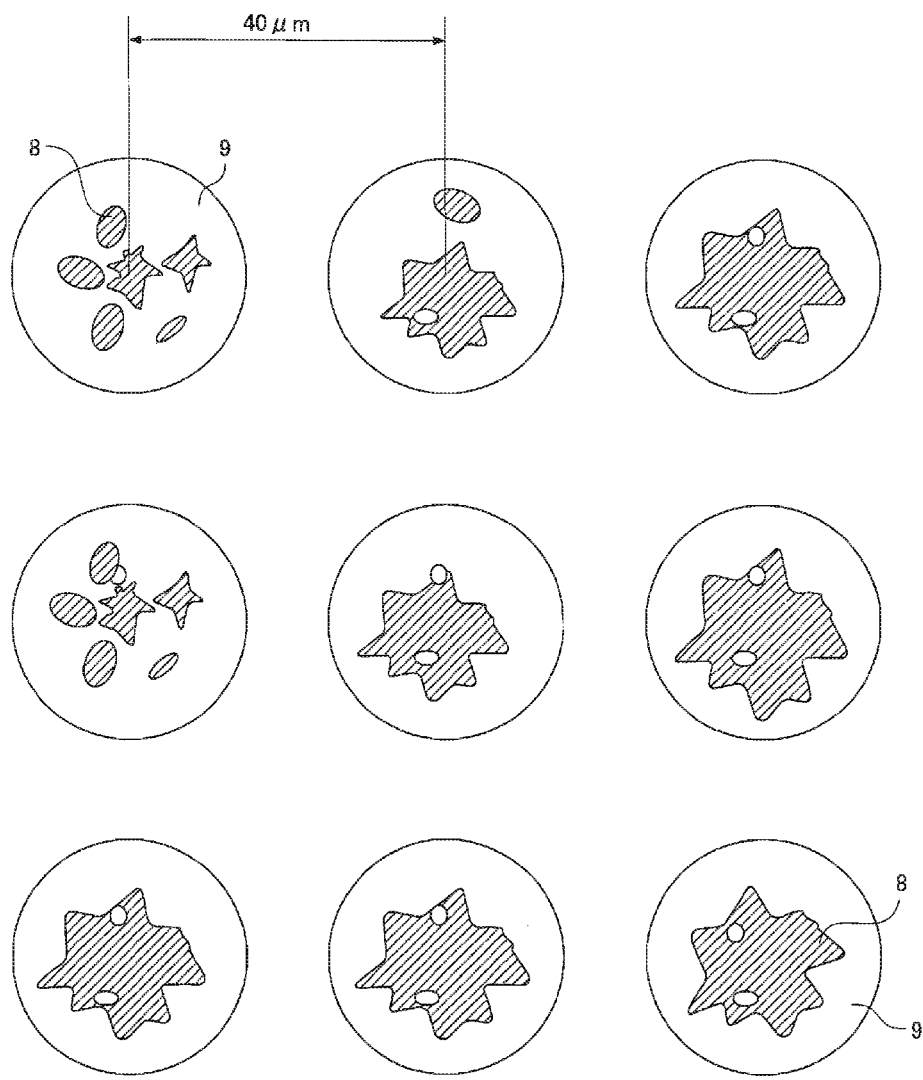
FIG. 2 is a cross-sectional view for explaining the mounting structure according to the first embodiment.

FIG. 2 is a cross-sectional view for explaining the mounting structure according to the first embodiment. Specifically, FIG. 2 is a cross-sectional view taken along the line A-A of FIG. 1 so as to illustrate the junctions on a plane located between the protruding electrodes 6 on the semiconductor chip 1 and the protruding electrodes 7 on the circuit board 2.

In the first embodiment, as shown in FIG. 2, the junctions connecting the electrode terminals 4 of the semiconductor chip 1 and the electrode terminals 5 of the circuit board 2 are evenly spaced in a lattice pattern. Thus, like the junctions, the electrode terminals 4 of the semiconductor chip 1 and the electrode terminals 5 of the circuit board 2 are also evenly spaced in a lattice pattern.

As shown in FIG. 1, in the cooling process of the molten solder 9, which will be described later, the semiconductor chip 1 is slightly curved. This is because a thermal stress caused by a difference in modulus of elasticity and a difference in linear expansion coefficient between the semiconductor chip 1 and the circuit board 2 concentrates on the junctions located on the outer periphery of the semiconductor chip 1. Hence, the junctions located on the outer periphery of the semiconductor chip 1 are stretched, so that as shown in FIG. 2, the alloy layer 8 in the junctions located on the outer periphery has a smaller cross-sectional area than the alloy layer 8 in the junctions located at other points. If the semiconductor chip 1 has a rectangular outside shape, the alloy layer 8 in the junctions has a small cross-sectional area particularly around the corners of the rectangular outside shape of the semiconductor chip 1. The solder 9 has a small width (not shown) in the junctions on the outer periphery of the semiconductor chip 1 (particularly at the corner portions of the rectangular outside shape of the semiconductor chip 1). The corners of the semiconductor chip are points that connect two sides or two ends of the outside shape of the semiconductor chip, on the major surface (element surface) of the semiconductor chip in plan view. The two sides or ends form an angle smaller than 180°. For example, if the semiconductor chip has a rectangular outside shape, two sides or two ends form an angle of 90° at the corners of the semiconductor chip. Moreover, the corner portions of the semiconductor chip indicate the portions of the junctions around the corners of the outside shape of the semiconductor chip on the outer periphery of the semiconductor chip.

In the first embodiment, the semiconductor chip 1 has a rectangular outside shape of 4 mm×4 mm and has a thickness of 0.2 mm. The circuit board 2 has a rectangular outside shape of 8 mm×8 mm and has a thickness of 0.5 mm. The electrode terminals 4 of the semiconductor chip 1 are shaped like circles that are 20 µm in diameter and are evenly spaced in a lattice pattern with a pitch of 40 µm between the electrode terminals (a center to center distance of 40 µm between the adjacent electrode terminals 4). Similarly, the electrode terminals 5 of the circuit board 2 are shaped like circles having a diameter of 20 µm and are evenly spaced in a lattice pattern with a pitch of 40 µm between the electrode terminals (a center to center distance of 40 µm between the adjacent electrode terminals 5). The electrode terminals 4 of the semiconductor chip 1 and the electrode terminals 5 of the circuit board 2 have circular surfaces exposed with a diameter of 10 µm from the insulating film. The electrode terminals 4 and 5 are 1.0 µm to 2.0 µm in thickness.

Figure 3:
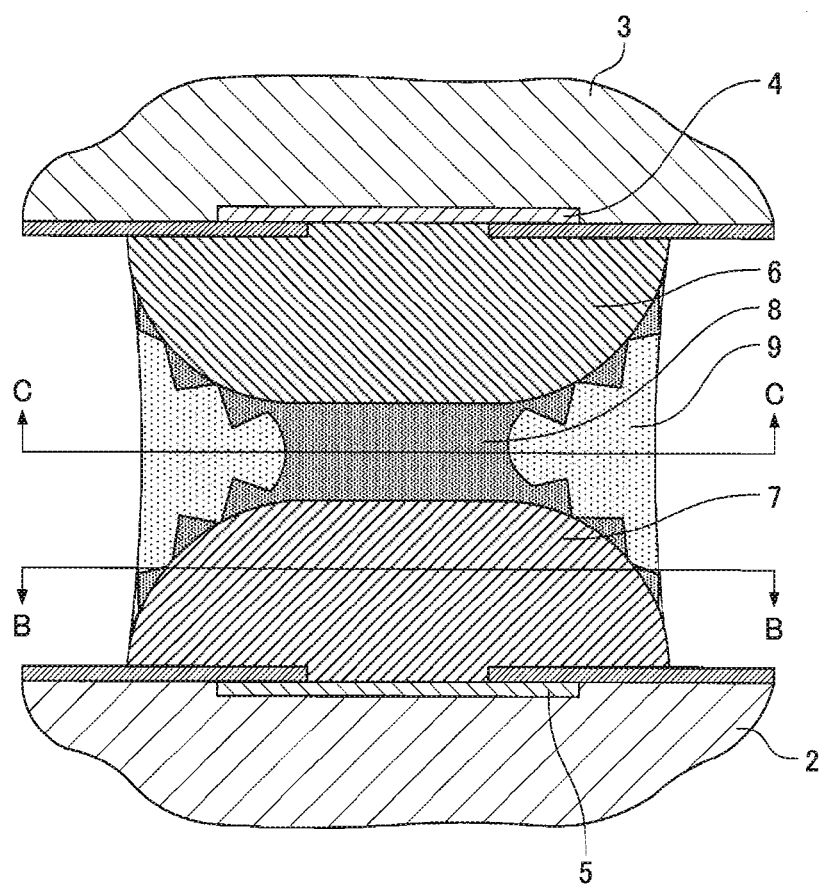
FIG. 3 is an enlarged cross-sectional view for explaining the mounting structure according to the first embodiment.

FIG. 3 is an enlarged cross-sectional view for explaining the mounting structure according to the first embodiment. As shown in FIG. 3, the alloy layer 8 is formed on the surface of the protruding electrode 6 provided on the electrode terminal 4 of the semiconductor chip 1. Similarly, the alloy layer 8 is also formed on the surface of the protruding electrode 7 provided on the electrode terminal 5 of the circuit board 2. The surfaces of the protruding electrodes 6 and the protruding electrodes 7 are joined to the solder 9 via the alloy layer 8.

Moreover, the alloy layer 8 grown from the protruding electrode 6 on the semiconductor chip 1 and the alloy layer 8 grown from the protruding electrode 7 on the circuit board 2 are electrically and mechanically connected to each other. The alloy layer 8 connecting the protruding electrode 6 on the semiconductor chip 1 and the protruding electrode 7 on the circuit board 2 is also joined to the solder 9 surrounding the alloy layer 8.

In the first embodiment, the alloy layer 8 has a minimum thickness of 0.1 µm and a maximum thickness of 6.0 µm at the junction connecting the protruding electrode 6 on the semiconductor chip 1 and the protruding electrode 7 of the circuit board 2. Thus, in the first embodiment, the alloy layer 8 has a thickness of 0.1 µm to 6.0 µm.

Figure 4A:
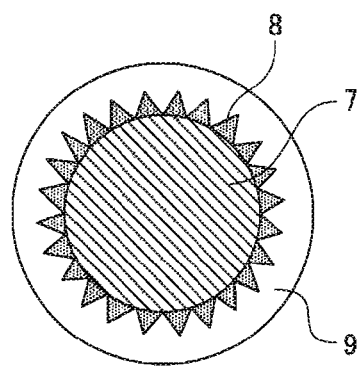
FIG. 4A is an enlarged cross-sectional view for explaining the mounting structure according to the first embodiment.
Figure 4B:
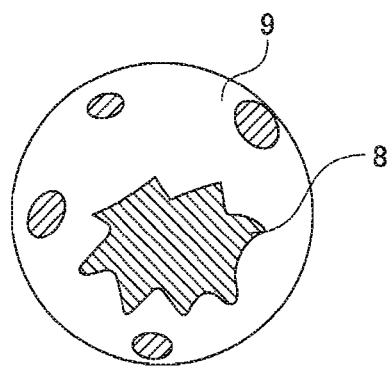
FIG. 4B is an enlarged cross-sectional view for explaining the mounting structure according to the first embodiment.

FIGS. 4A and 4B are enlarged cross-sectional views for explaining the mounting structure according to the first embodiment. Specifically, FIG. 4A is a cross-sectional view taken along the line B-B of FIG. 3. FIG. 4A shows the junction cut along a plane near the circuit board 2. FIG. 4B is a cross-sectional view taken along the line C-C of FIG. 3. FIG. 4B shows the junction cut along a plane located between the protruding electrode 6 on the semiconductor chip 1 and the protruding electrode 7 on the circuit board 2.

As shown in FIG. 4A, near the circuit board 2, the ring-shaped solder 9 is disposed around the circular protruding electrode 7 while the alloy layer 8 is formed between the protruding electrode 7 and the solder 9.

As shown in FIG. 4B, at a position where the alloy layers 8 grown from the protruding electrodes 6 and 7 are connected to each other, the solder 9 contains multiple spots of the alloy layer 8. Thus, the junction has a cross section structure including the alloy layer 8 surrounded by the solder 9 that is an example of a metal having a lower modulus of elasticity than the alloy layer 8.

Although not shown, the alloy layer 8 is formed by growing multiple shell-like alloys formed on the surfaces of the protruding electrodes 6 and 7. The alloy layer 8 has fine irregularities on the surface.

Figure 5:
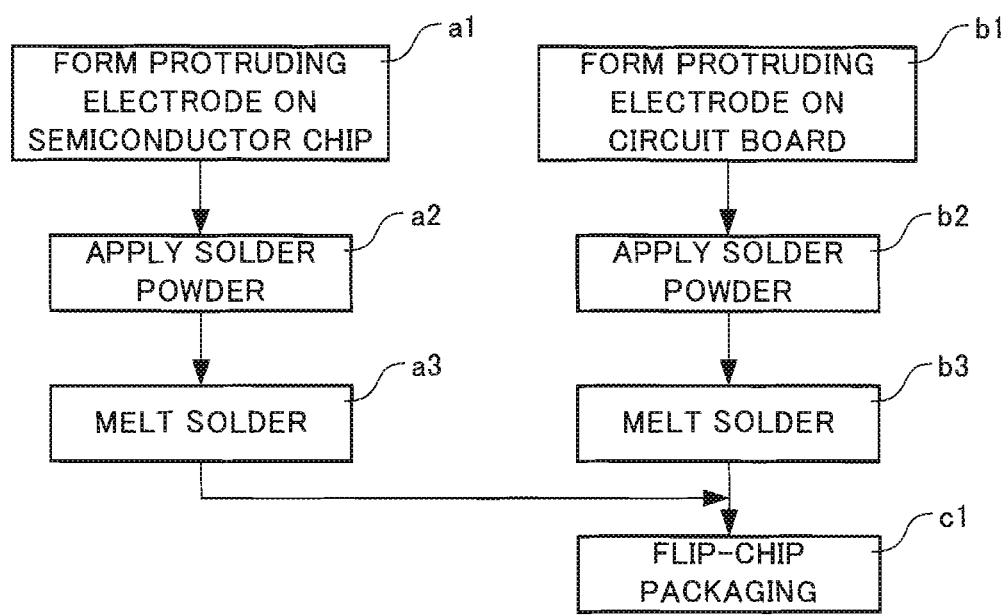
FIG. 5 is a flowchart showing a manufacturing method for the mounting structure according to the first embodiment.

A manufacturing method for the mounting structure according to the first embodiment will be described below. FIG. 5 is a flowchart showing the manufacturing method for the mounting structure according to the first embodiment. FIGS. 6A to 6I are process cross-sectional views for explaining the manufacturing method for the mounting structure according to the first embodiment.

Figure 6A:
FIG. 6A is a process cross-sectional view for explaining the manufacturing method for the mounting structure according to the first embodiment.
Figure 6B:
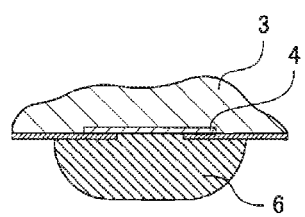
FIG. 6B is a process cross-sectional view for explaining the manufacturing method for the mounting structure according to the first embodiment.

As shown in FIGS. 6A and 6B, the protruding electrode 6 that is a dome with a flat portion is formed on the electrode terminal 4 of the semiconductor chip 1 by electroless plating (step a1 in FIG. 5). The protruding electrode 6 is an example of a shape having a curvature on the edge. Specifically, impurities are first removed from the surface of the electrode terminal 4 made of Al. After that, the semiconductor chip 1 is immersed into a zinc plating solution so as to undergo a substitution reaction between Al and Zn of the electrode terminal 4. Subsequently, Zn nuclei are removed from the electrode terminal 4. The semiconductor chip 1 is then immersed into the zinc plating solution again. This grows finer Zn nuclei on Al of the electrode terminal 4. Subsequently, the semiconductor chip 1 is immersed into a Ni—P plating solution, so that Zn dissolves and a Ni—P coating is grown on Al of the electrode terminal 4. The semiconductor chip 1 is then immersed into an electroless gold plating solution. Thus, a Au coating is grown on Ni—P. In the first embodiment, the protruding electrode 6 is 10 µm in height and the bottom of the protruding electrode 6 is 30 µm in diameter.

Figure 6C:
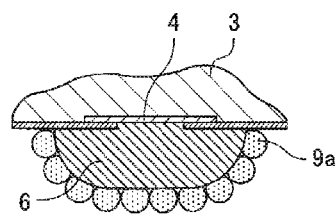
FIG. 6C is a process cross-sectional view for explaining the manufacturing method for the mounting structure according to the first embodiment.

Subsequently, as shown in FIG. 6C, solder powder 9a is supplied to the surface of the protruding electrode 6 of the semiconductor chip 1 (step a2 in FIG. 5).

The solder powder 9a may be transferred to the surface of the protruding electrode 6 of the semiconductor chip 1 as follows: for example, a solder transfer sheet including an adhesive layer formed on a transfer base is stacked on the heated semiconductor chip 1 such that the adhesive layer with evenly applied fine solder powder or solder particles is opposed to the protruding electrode 6, and the semiconductor chip 1 is pressed to the solder transfer sheet. At this point, Ni atoms (not shown) of the protruding electrode 6 are diffused into the solder powder 9a, forming multiple shell-shaped portions of the alloy layer 8 on the interface between the protruding electrode 6 and the solder powder 9a. The alloy layer 8 is composed of, for example, Ni—Sn alloys such as $Ni_3Sn_4$.

Alternatively, the solder powder 9a may be bonded to the surface of the protruding electrode 6 of the semiconductor chip 1 as follows: for example, after the semiconductor chip 1 is immersed into a tackifier compound composed of a naphthotriazole dielectric, a benzotriazole dielectric, and so on, the semiconductor chip 1 is sprinkled with fine solder powder or solder particles and then is cleaned.

Figure 6D:
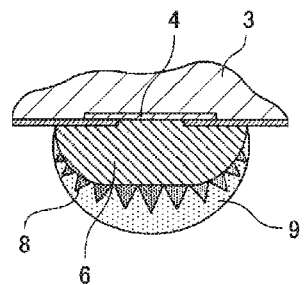
FIG. 6D is a process cross-sectional view for explaining the manufacturing method for the mounting structure according to the first embodiment.
Figure 6E:
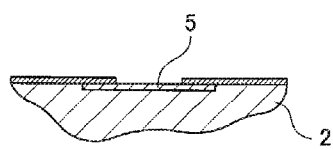
FIG. 6E is a process cross-sectional view for explaining the manufacturing method for the mounting structure according to the first embodiment.
Figure 6F:
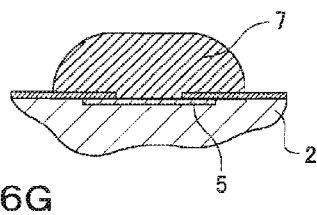
FIG. 6F is a process cross-sectional view for explaining the manufacturing method for the mounting structure according to the first embodiment.
Figure 6G:
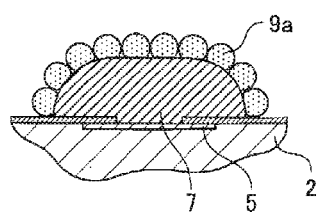
FIG. 6G is a process cross-sectional view for explaining the manufacturing method for the mounting structure according to the first embodiment.
Figure 6H:
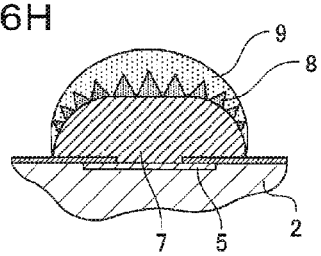
FIG. 6H is a process cross-sectional view for explaining the manufacturing method for the mounting structure according to the first embodiment.

After the step of bonding the solder powder 9a to the surface of the protruding electrode 6, the semiconductor chip 1 is heated in a reflow furnace at least to a solder melting point. Thus, the liquid solder powder 9a is melted so as to be continuously supplied by the surface tension (step a3 in FIG. 5). Hence, as shown in FIG. 6D, the protruding electrode 6 on the semiconductor chip 1 is precoated like a dome with the solder 9. At this point, in the process of melting solder, Ni atoms contained in the protruding electrode 6 are diffused into molten solder, and the shell-shaped alloy layer 8 is grown on the interface between the protruding electrode 6 and the solder 9.

In the step of melting the solder powder 9a, flux may be used to remove an oxide film on a solder surface. Specifically, the solder 9 may be melted by applying flux to the semiconductor chip 1 and then heating the semiconductor chip 1 at least to the melting point of solder in, for example, an atmosphere of inert gas of $N_2$ in a $N_2$ reflow furnace. In the use of flux, after the precoating of the solder 9 on the protruding electrodes 6 on the semiconductor chip 1, the flux is rinsed out with a cleaning fluid, e.g., isopropyl alcohol (IPA), ethanol, glycol, and a surface-active agent. Alternatively, the semiconductor chip 1 may be heated in a reducing atmosphere of, for example, formic acid or hydrogen by using a reflow furnace for reduction instead of flux.

As shown in FIGS. 6E to 6H, the circuit board 2 undergoes the same processing as the semiconductor chip 1. Specifically, first, the protruding electrode 7 that is a dome with a flat portion is formed on each of the electrode terminals 5 of the circuit board 2 by electroless plating (step b1 in FIG. 5). The protruding electrode 7 is an example of a shape having a curvature on the edge. Subsequently, the solder powder 9a is fed onto the protruding electrode 7 (step b2 in FIG. 5). The circuit board 2 is then heated at least to the melting point of solder, thereby melting the solder powder 9a (step b3 in FIG. 5). Hence, the protruding electrodes 7 are precoated with the solder 9 into domes. During the same processing on the circuit board 2 as on the semiconductor chip 1, multiple shell-shaped portions of the alloy layer 8 are formed and grown on the interface between the protruding electrode 7 and the solder 9. The alloy layer 8 is composed of, for example, Ni—Sn alloys such as $Ni_3Sn_4$. In the first embodiment, the protruding electrode 7 is 10 m in height and the bottom of the protruding electrode 7 is 30 µm in diameter.

Figure 6I:
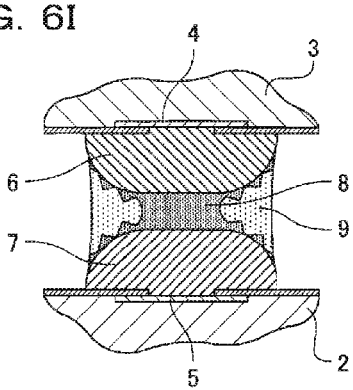
FIG. 6I is a process cross-sectional view for explaining the manufacturing method for the mounting structure according to the first embodiment.

Subsequently, as shown in FIG. 6I, the electrode terminal 4 of the semiconductor chip 1 is aligned with the electrode terminal 5 of the circuit board 2, and then the semiconductor chip 1 is pressed and mounted onto the circuit board 2 while being heated with the circuit board 2 (step c1 in FIG. 5).

Specifically, the semiconductor chip 1 and the circuit board 2 are first heated in an atmosphere of inert gas such as N2 so as to heat the solder 9 on the semiconductor chip 1 and the circuit board 2 at least to the melting point of solder (e.g., 220° C. to 260° C.). Thus, the solder 9 melts and the alloy layer 8 having fine irregularities starts growing on the surfaces of the protruding electrodes 6 and 7. The semiconductor chip 1 is then pressed onto the circuit board 2 with the molten solder 9 on the semiconductor chip 1 and the circuit board 2. This mixes the molten solder 9 on the semiconductor chip 1 and the molten solder 9 on the circuit board 2. Subsequently, the semiconductor chip 1 is kept pressed to the circuit board 2 for a certain period of time. The semiconductor chip 1 and the circuit board 2 are then cooled at least to the solidifying point of solder. This solidifies the solder 9 so as to form the solder junctions. In other words, the solidification forms the junctions connecting the electrode terminals 4 of the semiconductor chip 1 and the electrode terminals 5 of the circuit board 2. After that, the semiconductor chip 1 and the circuit board 2 are further cooled to room temperature. Hence, the mounting structure is obtained.

In the step of mounting the semiconductor chip (step c1 in FIG. 5), Ni atoms contained in the protruding electrodes 6 and 7 are diffused during the melting of solder, thereby growing the alloy layer 8 on both of the protruding electrodes 6 and 7. In the first embodiment, the alloy layer 8 grows on both of the protruding electrodes 6 and 7 so as to connect the protruding electrodes 6 and 7. The semiconductor chip 1 is kept pressed onto the circuit board 2 until the connecting portion of the alloy layers 8 is surrounded by the solder 9.

As has been discussed, the manufacturing method for the mounting structure according to the first embodiment includes: growing the alloy layer 8 composed of a metal (nickel) constituting the protruding electrode 6 and a metal (tin) constituting the solder 9 and the alloy layer 8 composed of a metal (nickel) constituting the protruding electrode 7 and the metal (tin) constituting the solder 9, by melting the solder 9 that joins the protruding electrode 6 having a curvature on the edge on the electrode terminal 4 and the protruding electrode 7 having a curvature on the edge on the electrode terminal 5; and cooling the molten solder 9 so as to form the junction that connects the electrode terminal 4 and the electrode terminal 5, the junction having a cross section structure including the alloy layer 8 surrounded by the solder 9 having a lower modulus of elasticity than the alloy layer 8.

According to the first embodiment, in the step of cooling the molten solder 9 to room temperature, the protruding electrodes 6 and 7 and the alloy layer 8 are surrounded by the molten solder 9 having a lower modulus of elasticity than the protruding electrodes 6 and 7 and the alloy layer 8. Thus, also in the actual use of a semiconductor device including the mounting structure of the first embodiment, the protruding electrodes 6 and 7 and the alloy layer 8 are surrounded by the solidified solder 9 having a lower modulus of elasticity than the protruding electrodes 6 and 7 and the alloy layer 8. For example, the protruding electrodes 6 and 7 predominantly composed of Ni and the alloy layer 8 composed of a Ni—Sn alloy have a modulus of elasticity of 50 GPa to 60 GPa, whereas the solder 9 predominantly composed of Sn has a low modulus of elasticity of 20 GPa to 40 GPa. According to the first embodiment, the junction connecting the electrode terminals 4 and 5 has a modulus of elasticity of, for example, 25 GPa to 45 GPa.

Thus, in the actual use of the semiconductor device in the process of cooling the molten solder 9 to room temperature or in an environment where a large temperature difference occurs, the semiconductor chip 1 and the circuit board 2 have different elastic moduli and linear expansion coefficients. This reduces a tensile stress applied to the electrode terminal 4 of the semiconductor chip 1 because the junction connecting the electrode terminals 4 and 5 has a lower modulus of elasticity than the protruding electrodes 6 and 7 and the alloy layer 8. When the tensile stress applied to the electrode terminal 4 of the semiconductor chip 1 is reduced, a tensile stress applied to the low-dielectric constant insulating layer 3 located immediately under the electrode terminal 4 of the semiconductor chip 1 falls below the destructive strength of the low-dielectric constant insulating layer 3. This prevents exfoliation and a crack on the fragile low-dielectric constant insulating layer 3 immediately under the electrode terminal 4 of the semiconductor chip 1, achieving the mounting structure with high connection reliability.

In the first embodiment, the protruding electrodes 6 and 7, in particular, have curvatures on the edges, and thus even if the solder 9 contained in the junctions on the outer periphery of the semiconductor chip 1 is extended by a thermal stress caused by a difference in modulus of elasticity and a difference in linear expansion coefficient between the semiconductor chip 1 and the circuit board 2 in the process of cooling the molten solder 9, the solder 9 does not considerably increase the areas of the exposed surfaces of the protruding electrodes 6 and 7 included in the junctions disposed on the outer periphery of the semiconductor chip 1. Therefore, the first embodiment prevents exfoliation and a crack on the fragile low-dielectric constant insulating layer 3 on the outer periphery of the semiconductor chip 1, achieving the mounting structure with high connection reliability.

As described above, according to the first embodiment, the junction connecting the electrode terminal 4 of the semiconductor chip 1 and the electrode terminal 5 of the circuit board 2 includes the cross section structure including the protruding electrodes 6 and 7 and the alloy layer 8 surrounded by the solder 9 that is an example of a metal having a lower modulus of elasticity than the protruding electrodes 6 and 7 and the alloy layer 8. This reduces a stress applied to the fragile low-dielectric constant insulating layer 3, achieving the mounting structure with high connection reliability.

Even if a large current flows between the electrode terminals 4 and 5 at a high temperature, the protruding electrode 6 on the electrode terminal 4 and the protruding electrode 7 on the electrode terminal 5 are connected to each other via the alloy layer 8, suppressing migration of Ni atoms contained in the protruding electrodes 6 and 7 and Sn atoms contained in the solder 9, the migration being caused by an electromigration phenomenon. This suppresses the growth of the alloy layer 8. In other words, the alloy layer 8 is stabilized. Hence, the mounting structure according to the first embodiment can maintain stable bonding between the electrode terminals 4 and 5 and reduce fluctuations in connection resistance between the electrode terminals 4 and 5.

For example, since a current of 100 mA was continuously applied between the pair of electrode terminals 4 and 5 at an ambient temperature of 170° C., a fluctuation in connection resistance was 3% or less after 350 hours. Furthermore, the junction was ground in cross section and then the ground junction was observed, proving that the alloy layer 8 was stably connected between the protruding electrodes 6 and 7 and a void or abnormal growth of the alloy layer 8 was absent. Consequently, high connection reliability was confirmed also in high temperature/energization evaluation.

A clearance between the semiconductor chip 1 and the circuit board 2 may be filled with molding resin (not shown) by a dispenser. The molding resin further reduces a stress applied to the electrode terminal 4 of the semiconductor chip 1, further improving connection reliability between the electrode terminal 4 of the semiconductor chip 1 and the electrode terminal 5 of the circuit board 2.

Depending upon the process of continuously pressing the semiconductor chip 1 to the circuit board 2 for a certain period of time, the alloy layers 8 grown from the surfaces of the protruding electrodes 6 and 7 may not be connected to each other so as to locate only the solder 9 between the alloy layers 8. In this case, the alloy layers 8 may be connected by, for example, heating the solidified solder 9 with a heating device such as a $N_2$ reflow furnace and a reflow furnace for reduction, and then remelting the solder 9 so as to further grow the alloy layers 8.

Also in the case where the alloy layers 8 grown from the surfaces of the protruding electrodes 6 and 7 are connected to each other in the process of continuously pressing the semiconductor chip 1 to the circuit board 2 for a certain period of time, the alloy layers 8 may be further grown by heating the solidified solder 9 and then remelting the solder 9. This can further stabilize the alloy layer 8 so as to keep the stable connection between the electrode terminals 4 and 5 and reduce fluctuations in connection resistance between the electrode terminals 4 and 5.

Alternatively, after the solder 9 is solidified, a large current may be applied between the electrode terminals 4 and 5 so as to further grow the alloy layers 8 by an electromigration phenomenon. This can further stabilize the alloy layer 8 so as to keep the stable connection between the electrode terminals 4 and 5 and reduce fluctuations in connection resistance between the electrode terminals 4 and 5.

As has been discussed, the first embodiment can obtain high connection reliability even if the pitches between the electrode terminals are reduced in the mounting structure where the electrode terminals of the semiconductor chip and the electrode terminals of the circuit board are electrically and mechanically connected to each other via the fine solder junctions.

Second Embodiment

According to a second embodiment, differences from the first embodiment will be described below. The same explanation as in the first embodiment is optionally omitted. The second embodiment is different from the first embodiment in that the protruding electrodes 7 are replaced with flat electrodes on electrode terminals 5 of a circuit board 2.

Figure 7:
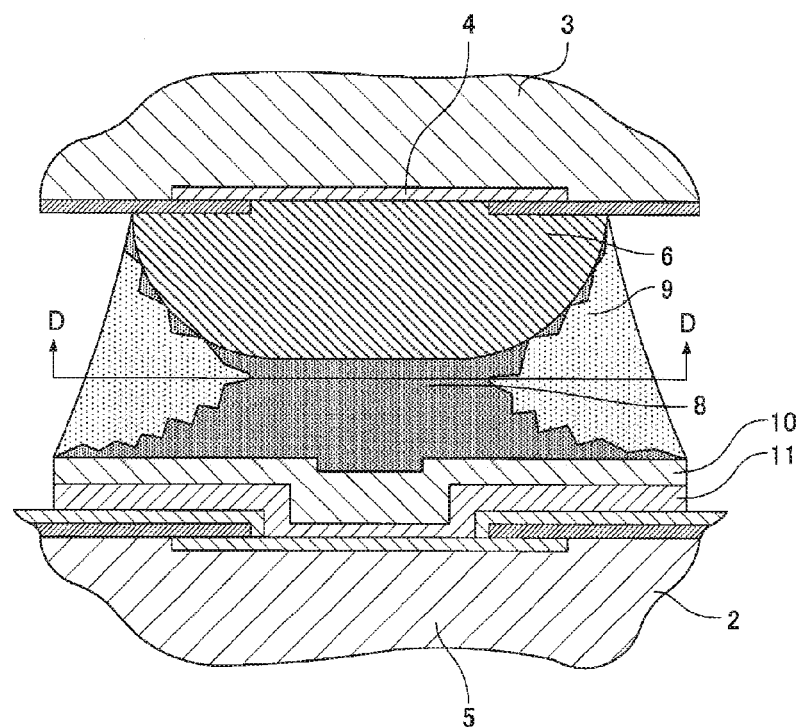
FIG. 7 is an enlarged cross-sectional view for explaining a mounting structure according to a second embodiment.

FIG. 7 is an enlarged cross-sectional view for explaining a mounting structure according to the second embodiment. Also in the second embodiment, Al is selected as the materials of electrode terminals 4 of a semiconductor chip 1 and the electrode terminals 5 of the circuit board 2 as in the first embodiment. In the following explanation, the main component of protruding electrodes 6 on the semiconductor chip 1 is Ni, the main component of solder 9 is Sn, and an alloy layer 8 is composed of Ni—Sn alloys such as $Ni_3Sn_4$.

In the second embodiment, the semiconductor chip 1 has a rectangular outside shape of 4 mm×4 mm and has a thickness of 0.2 mm. The circuit board 2 has a rectangular outside shape of 8 mm×8 mm and has a thickness of 0.5 mm. The electrode terminals 4 of the semiconductor chip 1 and the electrode terminals 5 of the circuit board 2 are shaped like circles that are 25 μm in diameter and are evenly spaced in a lattice pattern with a pitch of 50 μm between the electrode terminals. The electrode terminals 4 of the semiconductor chip 1 and the electrode terminals 5 of the circuit board 2 have circular surfaces exposed with a diameter of 15 μm from an insulating film. The electrode terminals 4 and 5 are 1.0 μm in thickness.

As shown in FIG. 7, in the second embodiment, a barrier metal electrode 10 is formed as an example of a flat electrode on the electrode terminal 5 of the circuit board 2. The barrier metal electrode 10 is circular in plan view and is predominantly composed of Ni. The electrode terminals 4 of the semiconductor chip 1 and the electrode terminals 5 of the circuit board 2 are electrically and mechanically connected to each other via the protruding electrodes 6 provided on the electrode terminals 4 of the semiconductor chip 1, the barrier metal electrodes 10 provided on the electrode terminals 5 of the circuit board 2, the alloy layer 8, and the solder 9 that is an example of a metal having a lower modulus of elasticity than the protruding electrodes 6, the barrier metal electrodes 10, and the alloy layer 8. The protruding electrode 6 is an example of a shape having a curvature on the edge and is shaped like a dome with a flat portion. Thus, a junction connecting the electrode terminal 4 of the semiconductor chip 1 and the electrode terminal 5 of the circuit board 2 is composed of the protruding electrode 6, the barrier metal electrode 10, the alloy layer 8, and the solder 9.

Specifically, as shown in FIG. 7, the alloy layer 8 is formed on the surfaces of the protruding electrode 6 provided on the electrode terminal 4 of the semiconductor chip 1 and the barrier metal electrode 10 provided on the electrode terminal 5 of the circuit board 2. The surfaces of the protruding electrode 6 and the barrier metal electrode 10 are joined to the solder 9 via the alloy layer 8. Moreover, the alloy layer 8 grown from the protruding electrode 6 on the semiconductor chip 1 and the alloy layer 8 grown from the barrier metal electrode 10 of the circuit board 2 are electrically and mechanically connected to each other. The alloy layer 8 connecting the protruding electrode 6 on the semiconductor chip 1 and the barrier metal electrode 10 of the circuit board 2 is also joined to the solder 9 surrounding the alloy layer 8.

In the second embodiment, the alloy layer 8 has a minimum thickness of 0.1 μm and a maximum thickness of 6.0 μm at the junction connecting the protruding electrode 6 on the semiconductor chip 1 and the barrier metal electrode 10 of the circuit board 2. Thus, in the second embodiment, the alloy layer 8 has a thickness of 0.1 μm to 6.0 μm.

Figure 8:
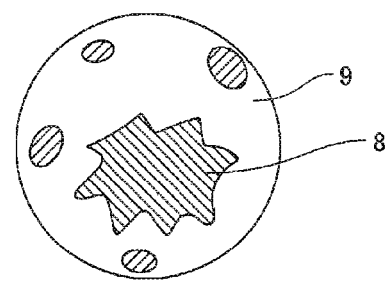
FIG. 8 is an enlarged cross-sectional view for explaining the mounting structure according to the second embodiment.

FIG. 8 is an enlarged cross-sectional view for explaining the mounting structure according to the second embodiment. Specifically, FIG. 8 is a cross-sectional view taken along the line D-D of FIG. 7. FIG. 8 shows the junction cut along a plane located between the protruding electrode 6 on the semiconductor chip 1 and the barrier metal electrode 10 of the circuit board 2.

As shown in FIG. 8, the solder 9 contains multiple portions of the alloy layer 8 at a position where the alloy layers 8 grown from the protruding electrode 6 and the barrier metal electrode 10 are connected to each other. Thus, the junction has a cross section structure including the alloy layer 8 surrounded by the solder 9 that is an example of a metal having a lower modulus of elasticity than the alloy layer 8.

Figure 9:
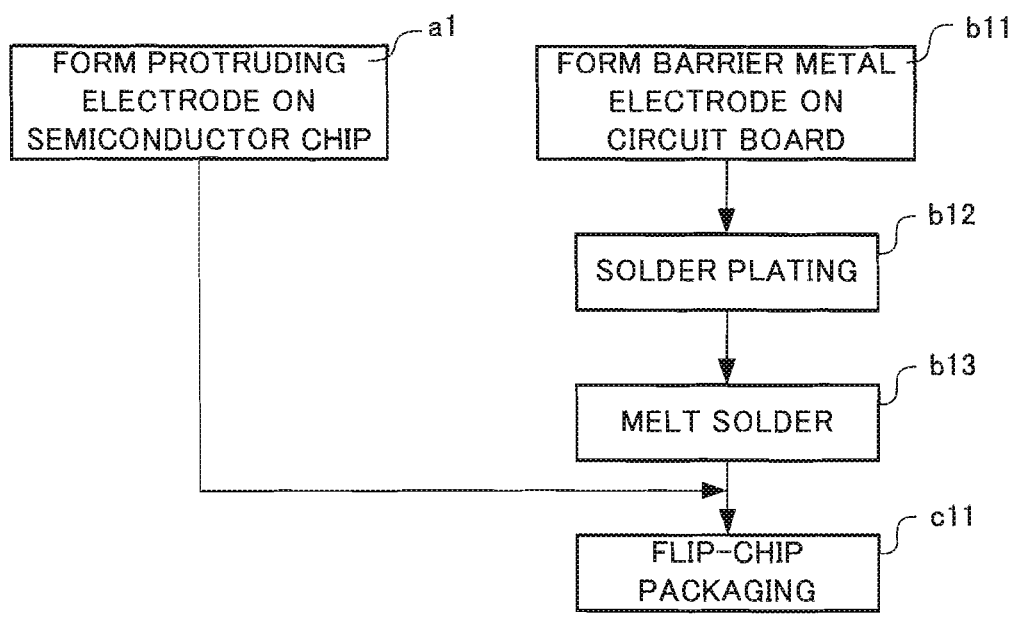
FIG. 9 is a flowchart showing a manufacturing method for the mounting structure according to the second embodiment.

A manufacturing method for the mounting structure according to the second embodiment will be described below. FIG. 9 is a flowchart showing the manufacturing method for the mounting structure according to the second embodiment.

FIGS. 10A to 10G are process cross-sectional views for explaining the manufacturing method for the mounting structure according to the second embodiment.

Figure 10A:
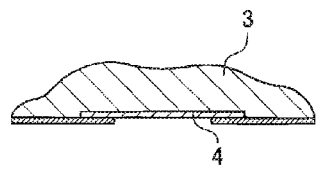
FIG. 10A is a process cross-sectional view for explaining the manufacturing method for the mounting structure according to the second embodiment.
Figure 10B:
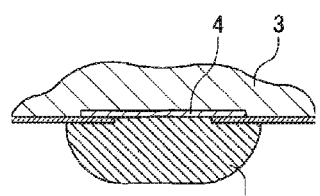
FIG. 10B is a process cross-sectional view for explaining the manufacturing method for the mounting structure according to the second embodiment.

As shown in FIGS. 10A and 10B, the protruding electrode 6 that is a dome with a flat portion is formed on the electrode terminal 4 of the semiconductor chip 1 by electroless plating (step a1 in FIG. 9) as in the first embodiment. The protruding electrode 6 is an example of a shape having a curvature on the edge. In the second embodiment, the protruding electrode 6 is 10 μm in height and the bottom of the protruding electrode 6 is 30 μm in diameter.

Figure 10C:
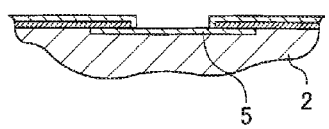
FIG. 10C is a process cross-sectional view for explaining the manufacturing method for the mounting structure according to the second embodiment.
Figure 10D:
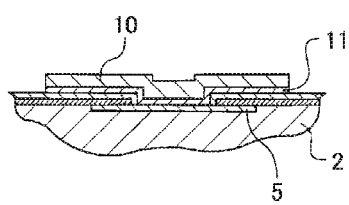
FIG. 10D is a process cross-sectional view for explaining the manufacturing method for the mounting structure according to the second embodiment.

As shown in FIGS. 10C and 10D, the barrier metal electrode 10 is formed on the electrode terminal 5 of the circuit board 2 (step b11 in FIG. 9). Specifically, a seed layer 11 made of, for example, Ti(titanium)/W(tungsten)/Cu is first formed on the electrode terminal 5 of the circuit board 2 by sputtering. After that, a barrier metal layer made of, for example, Ni is formed thereon by electrolytic plating. The unnecessary seed layer 11 and the unnecessary barrier metal layer are then removed by photolithography. Thus, the barrier metal electrode 10 is formed. In the second embodiment, the barrier metal electrode 10 is 25 μm in diameter and is 2.0 μm to 5.0 μm in thickness.

Figure 10E:
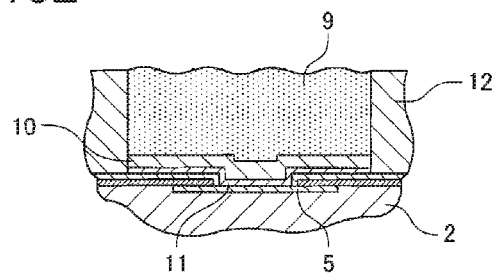
FIG. 10E is a process cross-sectional view for explaining the manufacturing method for the mounting structure according to the second embodiment.

Subsequently, as shown in FIG. 10E, the solder 9 is fed onto the barrier metal electrode 10 (step b12 in FIG. 9). Specifically, a resist film 12 having a thickness of 10 μm to 15 μm is formed on a plane where the electrode terminal 5 of the circuit board 2 is disposed, and then an opening that exposes the barrier metal electrode 10 is formed on the resist film 12. After that, the circuit board 2 is immersed into a solder plating solution so as to feed the solder 9 into the opening of the resist film 12.

Figure 10F:
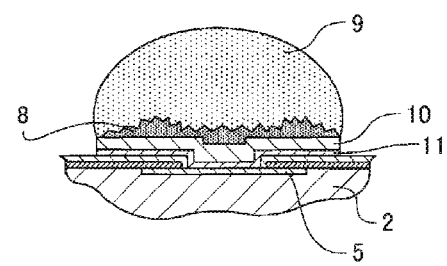
FIG. 10F is a process cross-sectional view for explaining the manufacturing method for the mounting structure according to the second embodiment.

After the resist film 12 is peeled off, the circuit board 2 is heated in a reflow furnace at least to the melting point of solder, thereby melting the solder 9 (step b13 in FIG. 9). Hence, as shown in FIG. 10F, the solder 9 on the barrier metal electrode 10 is shaped like a part of a sphere. In other words, a solder bump is formed on the barrier metal electrode 10. At this point, in the process of melting the solder 9, Ni atoms contained in the barrier metal electrode 10 are diffused into the solder so as to form multiple shell-shaped portions of the alloy layer 8 on the interface between the barrier metal electrode 10 and the solder 9. The alloy layer 8 is composed of, for example, Ni—Sn alloys such as $Ni_3Sn_4$. In the second embodiment, the solder bump has a height of 10 μm to 15 μm and a maximum diameter of 30 μm.

In the step of melting the solder 9, flux may be used to remove an oxide film on a solder surface. Specifically, the solder 9 may be melted by applying flux to the circuit board 2 and then heating the circuit board 2 at least to the melting point of solder in, for example, an atmosphere of inert gas of $N_2$ in a $N_2$ reflow furnace. In the use of flux, after the solder bumps are formed, the flux is rinsed out with a cleaning fluid, e.g., isopropyl alcohol (IPA), ethanol, glycol, and a surface-active agent. Alternatively, the circuit board 2 may be heated in a reducing atmosphere of, for example, formic acid or hydrogen by using a reflow furnace for reduction instead of flux.

Figure 10G:
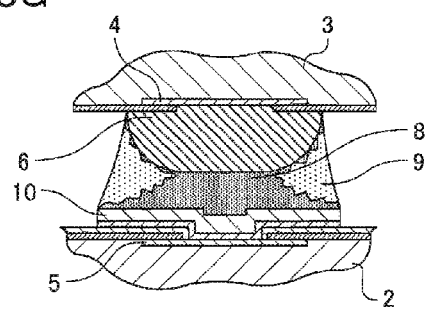
FIG. 10G is a process cross-sectional view for explaining the manufacturing method for the mounting structure according to the second embodiment.

Subsequently, as shown in FIG. 10G, the electrode terminals 4 of the semiconductor chip 1 are aligned with the electrode terminals 5 of the circuit board 2, and then the semiconductor chip 1 is pressed and mounted onto the circuit board 2 while being heated with the circuit board 2 in, for example, an atmosphere of inert gas of $N_2$ (step d1 in FIG. 9).

Specifically, the solder 9 is first heated at least to the melting point of solder (e.g., 220° C. to 260° C.) and thus the solder 9 melts. At this point, the alloy layer 8 starts growing on the surfaces of the barrier metal electrodes 10 of the circuit board 2. The semiconductor chip 1 is then pressed to the circuit board 2 with the molten solder 9. At this point, a diffusion reaction starts between the molten solder 9 and the protruding electrode 6 on the semiconductor chip 1, forming multiple shell-shaped portions of the alloy layer 8 on the interface between the protruding electrode 6 and the solder 9.

Subsequently, the semiconductor chip 1 is kept pressed to the circuit board 2 for a certain period of time. The semiconductor chip 1 and the circuit board 2 are then cooled at least to the solidifying point of solder. This solidifies the solder 9 so as to form solder junctions. In other words, the solidification forms the junctions connecting the electrode terminals 4 of the semiconductor chip 1 and the electrode terminals 5 of the circuit board 2. After that, the semiconductor chip 1 and the circuit board 2 are further cooled to room temperature. Hence, the mounting structure is obtained.

In the step of mounting the semiconductor chip (step c11 in FIG. 9), Ni atoms contained in the barrier metal electrode 10 of the circuit board 2 and the protruding electrode 6 on the semiconductor chip 1 are diffused during the melting of solder, thereby growing the alloy layer 8 on both of the barrier metal electrode 10 and the protruding electrode 6. In the second embodiment, the alloy layer 8 grows on both of the barrier metal electrode 10 and the protruding electrode 6 so as to connect the barrier metal electrode 10 and the protruding electrode 6. The semiconductor chip 1 is kept pressed onto the circuit board 2 until the connecting portion of the alloy layers 8 is surrounded by the solder 9.

As has been discussed, the manufacturing method for the mounting structure according to the second embodiment includes: growing the alloy layer 8 composed of a metal (nickel) constituting the protruding electrode 6 and a metal (tin) constituting the solder 9 and the alloy layer 8 composed of a metal (nickel) constituting the barrier metal electrode 10 and the metal (tin) constituting the solder 9, by melting the solder 9 that joins the protruding electrode 6 having a curvature on the edge on the electrode terminal 4 and the barrier metal electrode 10 that is an example of an flat electrode provided on the electrode terminal 5; and cooling the solder 9 so as to form the junction that connects the electrode terminal 4 and the electrode terminal 5, the junction having a cross section structure including the alloy layer surrounded by the solder 9 having a lower modulus of elasticity than the alloy layer 8.

According to the second embodiment, the protruding electrodes 7 are replaced with the flat electrodes on the electrode terminals 5 of the circuit board 2. Thus, in the mounting structure, the content of solder in the junction connecting the electrode terminal 4 of the semiconductor chip 1 and the electrode terminal 5 of the circuit board 2, that is, the content of Sn is larger than in the first embodiment. This can reduce the modulus of elasticity of the junction more than in the first embodiment. Hence, even if a fragile low-dielectric constant insulating layer 3 immediately under the electrode terminal 4 of the semiconductor chip 1 is an extremely low-k layer that is more fragile than an ultra low-k layer, exfoliation and a crack can be prevented on the low-dielectric constant insulating layer 3, achieving the mounting structure with higher connection reliability.

Third Embodiment

According to a third embodiment, differences from the first embodiment will be described below. The same explanation as in the first embodiment is optionally omitted. The third embodiment is different from the first embodiment in that the protruding electrodes 7 are replaced with cylindrical electrodes on electrode terminals 5 of a circuit board 2. The cylindrical electrodes are made of a metal having a lower modulus of elasticity than protruding electrodes 6 on a semiconductor chip 1.

Figure 11:
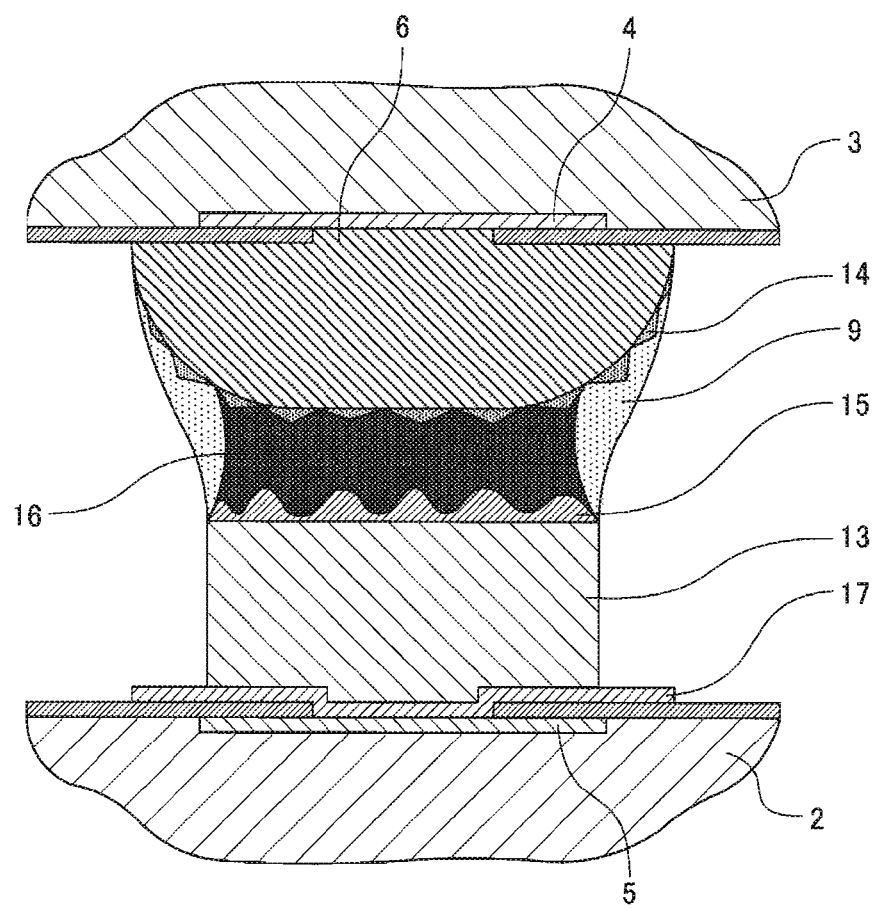
FIG. 11 is an enlarged cross-sectional view for explaining a mounting structure according to a third embodiment.

FIG. 11 is an enlarged cross-sectional view for explaining a mounting structure according to the second embodiment. Also in the third embodiment, Al is selected as the materials of electrode terminals 4 of the semiconductor chip 1 and the electrode terminals 5 of the circuit board 2 as in the first embodiment. In the following explanation, the main component of the protruding electrodes 6 on the semiconductor chip 1 is Ni and the main component of solder 9 is Sn.

In the third embodiment, the semiconductor chip 1 has a rectangular outside shape of 4 mm×4 mm and has a thickness of 0.2 mm. The circuit board 2 has a rectangular outside shape of 8 mm×8 mm and has a thickness of 0.5 mm. The electrode terminals 4 of the semiconductor chip 1 and the electrode terminals 5 of the circuit board 2 are shaped like circles that are 20 μm in diameter and are evenly spaced in a lattice pattern with a pitch of 40 μm between the electrode terminals. The electrode terminals 4 of the semiconductor chip 1 and the electrode terminals 5 of the circuit board 2 have circular surfaces exposed with a diameter of 10 μm from an insulating film. The electrode terminals 4 and 5 are 1.0 μm to 2.0 μm in thickness.

As shown in FIG. 11, in the third embodiment, a cylindrical electrode 13 predominantly composed of Cu is formed as an example of a cylindrical electrode on the electrode terminal 5 of the circuit board 2. The electrode terminals 4 of the semiconductor chip 1 and the electrode terminals 5 of the circuit board 2 are electrically and mechanically connected to each other via the protruding electrodes 6 provided on the electrode terminals 4 of the semiconductor chip 1, the cylindrical electrodes 13 provided on the electrode terminals 5 of the circuit board 2, first to third alloy layers 14 to 16, and the solder 9 that is an example of a metal having a lower modulus of elasticity than the protruding electrodes 6, the cylindrical electrodes 13, and the alloy layers 14 to 16. The protruding electrode 6 is an example of a shape having a curvature on the edge and is shaped like a dome with a flat portion. Thus, a junction connecting the electrode terminal 4 of the semiconductor chip 1 and the electrode terminal 5 of the circuit board 2 is composed of the protruding electrode 6, the cylindrical electrode 13, the first to third alloy layers 14 to 16, and the solder 9.

Specifically, as shown in FIG. 11, the first alloy layer 14 is formed on the surface of the protruding electrode 6 provided on the electrode terminal 4 of the semiconductor chip 1 while the second alloy layer 15 is formed on the top of the cylindrical electrode 13 provided on the electrode terminal 5 of the circuit board 2. The first alloy layer 14 and the second alloy layer 15 are electrically and mechanically connected to each other via the solder 9 and the third alloy layer 16. The third alloy layer 16 interposed between the protruding electrode 6 on the semiconductor chip 1 and the cylindrical electrode 13 on the circuit board 2 is also joined to the solder 9 that surrounds the third alloy layer 16. In the third embodiment, the first alloy layer 14 is grown to have a thickness of 1 μm to 5 μm. The second alloy layer 15 and the third alloy layer 16 are grown to have a thickness of 2 μm to 10 μm.

The first alloy layer 14 grown from the protruding electrode 6 on the semiconductor chip 1 is composed of alloys such as $Ni_3Sn_4$, $Ni_3Sn_2$, $Ni_3Sn$, and $Ni_3SnP$. In the third embodiment, a case where the first alloy layer 14 is composed of a Ni—Sn alloy such as $Ni_3Sn_4$ will be described. Hereinafter, the first alloy layer 14 will be referred to as a Ni—Sn (nickel-tin) alloy layer 14. In the third embodiment, the second alloy layer 15 grown from the cylindrical electrode 13 on the circuit board 2 is composed of Sn—Cu alloys such as $Cu_3Sn$ and $Cu_6Sn$, and the third alloy layer 16 grown on the interface between the first alloy layer 14 and the second alloy layer 15 is composed of Ni—Sn—Cu alloys such as $(Cu, Ni)_6Sn_5$ and $(Ni, Cu)_3Sn_2$. Hereinafter, the second alloy layer 15 will be referred to as a Sn—Cu (tin-copper) alloy layer 15 and the third alloy layer 16 will be referred to as a Ni—Sn—Cu (nickel-tin-copper) alloy layer 16.

As in the first and second embodiments, the solder 9 contains multiple portions (not shown) of the Ni—Sn alloy layer 14, the Sn—Cu alloy layer 15, and the Ni—Sn—Cu alloy layer 16. The junction connecting the electrode terminal 4 of the semiconductor chip 1 and the electrode terminal 5 of the circuit board 2 has a cross section structure in which the Ni—Sn alloy layer 14, the Sn—Cu alloy layer 15, and the Ni—Sn—Cu alloy layer 16 are surrounded by the solder 9 that is an example of a metal having a lower modulus of elasticity than the Ni—Sn alloy layer 14, the Sn—Cu alloy layer 15, and the Ni—Sn—Cu alloy layer 16.

Figure 12:
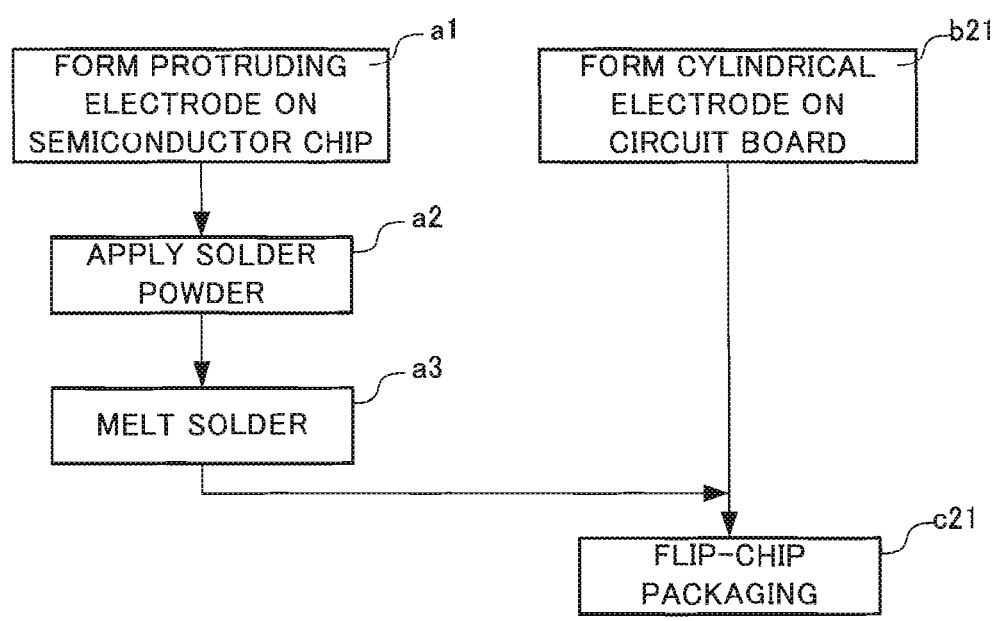
FIG. 12 is a flowchart showing a manufacturing method for the mounting structure according to the third embodiment.

A manufacturing method for the mounting structure according to the third embodiment will be described below. FIG. 12 is a flowchart showing the manufacturing method for the mounting structure according to the third embodiment. FIGS. 13A to 13G are process cross-sectional views for explaining the manufacturing method for the mounting structure according to the third embodiment.

As shown in FIGS. 13A to 13D, the protruding electrode 6 that is a dome with a flat portion is formed on the electrode terminal 4 of the semiconductor chip 1 by electroless plating (step a1 in FIG. 12) as in the first embodiment. The protruding electrode 6 is an example of a shape having a curvature on the edge.

Subsequently, solder powder 9a is fed onto the protruding electrode 6 (step a2 in FIG. 12). The semiconductor chip 1 is then heated at least to the melting point of solder, thereby melting the solder powder 9a (step a3 in FIG. 12). Hence, the protruding electrodes 6 are precoated with the solder 9 into domes. During the same processing on the semiconductor chip 1 as in the first embodiment, multiple shell-shaped portions of the Ni—Sn alloy layer 14 are formed and grown on the interface between the protruding electrode 6 and the solder 9. In the third embodiment, the protruding electrode 6 is 10 μm in height and the bottom of the protruding electrode 6 is 30 μm in diameter.

Figure 13A:
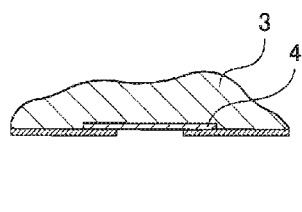
FIG. 13A is a process cross-sectional view for explaining the manufacturing method for the mounting structure according to the third embodiment.
Figure 13E:
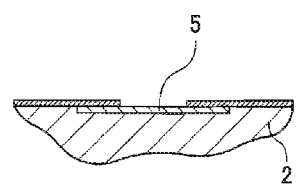
FIG. 13E is a process cross-sectional view for explaining the manufacturing method for the mounting structure according to the third embodiment.
Figure 13B:
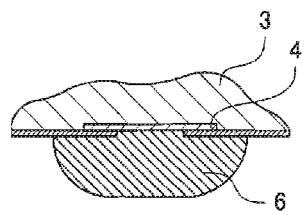
FIG. 13B is a process cross-sectional view for explaining the manufacturing method for the mounting structure according to the third embodiment.
Figure 13C:
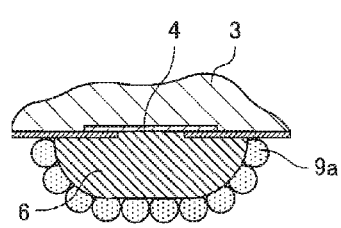
FIG. 13C is a process cross-sectional view for explaining the manufacturing method for the mounting structure according to the third embodiment.
Figure 13F:
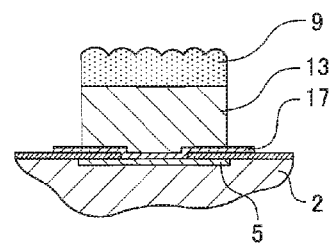
FIG. 13F is a process cross-sectional view for explaining the manufacturing method for the mounting structure according to the third embodiment.
Figure 13D:
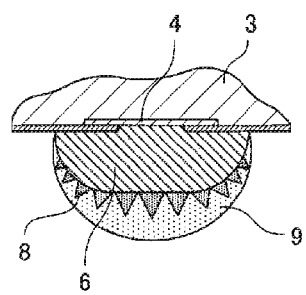
FIG. 13D is a process cross-sectional view for explaining the manufacturing method for the mounting structure according to the third embodiment.

As shown in FIGS. 13E and 13F, the cylindrical electrode 13 is formed on the electrode terminal 5 of the circuit board 2 by sputtering, electrolytic plating, and photolithography such that the top of the electrode 13 is covered with the solder 9 (step b21 in FIG. 12). Specifically, a seed layer 17 made of, for example, Ti/W/Cu is formed on the electrode terminal 5 of the circuit board 2 by sputtering. Subsequently, Cu is deposited on the seed layer 17 by electrolytic plating, and then solder is deposited on Cu by electrolytic plating. The unnecessary seed layer 17, Cu, and solder are removed by photolithography. Thus, the cylindrical electrode 13 is formed with the top covered with the solder 9. In the third embodiment, the cylindrical electrode 13 is 10 μm to 15 μm in height and is 18 μm to 22 μm in diameter.

Figure 13G:
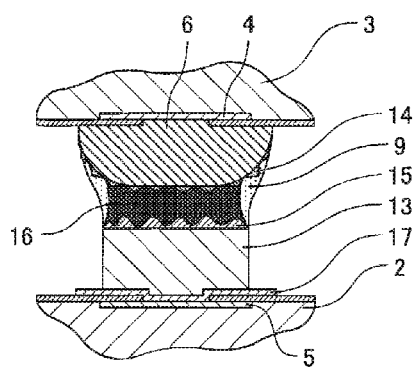
FIG. 13G is a process cross-sectional view for explaining the manufacturing method for the mounting structure according to the third embodiment.

Subsequently, as shown in FIG. 13G, the electrode terminals 4 of the semiconductor chip 1 are aligned with the electrode terminals 5 of the circuit board 2, and then the semiconductor chip 1 is pressed and mounted onto the circuit board 2 while being heated with the circuit board 2 (step c21 in FIG. 12).

Specifically, the semiconductor chip 1 and the circuit board 2 are first heated in, for example, an atmosphere of inert gas of $N_2$ so as to heat the solder 9 provided on the semiconductor chip 1 and the circuit board 2 at least to the melting point of solder (e.g., 220° C. to 260° C.) Thus, the solder 9 melts. The Ni—Sn alloy layer 14 at this point starts growing on the surfaces of the protruding electrodes 6 on the semiconductor chip 1.

Subsequently, the semiconductor chip 1 is pressed to the circuit board 2 with the molten solder 9 on the semiconductor chip 1 and the molten solder 9 on the circuit board 2. This mixes the molten solder 9 on the semiconductor chip 1 and the molten solder 9 on the circuit board 2 and diffuses Ni atoms contained in the protruding electrodes 6 on the semiconductor chip 1, thereby growing the Ni—Sn alloy layer 14 on the protruding electrodes 6. Meanwhile, Cu atoms contained in the cylindrical electrodes 13 on the circuit board 2 are diffused into the molten solder, forming multiple shell-shaped portions of the Sn—Cu alloy layer 15 on the interfaces between the cylindrical electrodes 13 and the solder 9.

The semiconductor chip 1 and the circuit board 2 are then cooled at least to the solidifying point of solder, thereby solidifying the solder 9. After that, the semiconductor chip 1 and the circuit board 2 are further cooled to room temperature so as to obtain the mounting structure.

In the third embodiment, the mounting structure that does not apply a load to the semiconductor chip 1 and the circuit board 2 is heated by a heating device, for example, a $N_2$ reflow furnace or a reflow furnace for reduction. Thus, the mounting structure is reheated at least to the melting point of solder and then the temperature is kept for a certain period of time. In this process, the Sn—Cu alloy layer 15 grows from the cylindrical electrode 13; meanwhile, the Ni—Sn alloy layer 14 on the protruding electrode 6 further grows. The Sn—Cu alloy layer 15 then reaches the Ni—Sn alloy layer 14, forming the Ni—Sn—Cu alloy layer 16 on the interface between the Ni—Sn alloy layer 14 and the Sn—Cu alloy layer 15.

In the third embodiment, the Ni—Sn alloy layer 14 grown from the protruding electrode 6 and the Sn—Cu alloy layer 15 grown from the cylindrical electrode 13 are connected to each other, and then the Ni—Sn—Cu alloy layer 16 is grown from the interface between the alloy layers 14 and 15. The mounting structure is kept at the melting point of solder or higher until the Ni—Sn alloy layer 14, the Sn—Cu alloy layer 15, and the Ni—Sn—Cu alloy layer 16 are surrounded by the solder 9 that is an example of a metal having a lower modulus of elasticity than the Ni—Sn alloy layer 14, the Sn—Cu alloy layer 15, and the Ni—Sn—Cu alloy layer 16. Preferably, the Ni—Sn—Cu alloy layer 16 is grown until a part of the surface of the protruding electrode 6 and a part of the surface of the cylindrical electrode 13 are electrically and mechanically connected only via the Ni—Sn—Cu alloy layer 16.

After that, the mounting structure is cooled at least to the solidifying point of solder. This solidifies the solder 9 so as to form the junction shown in FIG. 13G. The mounting structure is then further cooled to room temperature. Thus, the desired mounting structure can be obtained.

After the mounting structure including the semiconductor chip 1 mounted on the circuit board 2 is obtained, the mounting structure is reheated so as to grow the alloy layers 14, 15, and 16 in the junction. According to this process, a plurality of mounting structures cooled to room temperature can be simultaneously heated by a heating device, e.g., a $N_2$ reflow furnace or a reflow furnace for reduction, thereby simultaneously growing the alloy layers 14, 15 and 16 in the junctions of the mounting structures. Thus, higher productivity can be obtained. Alternatively, when the semiconductor chip 1 is mounted on the circuit board 2, the alloy layers 14, 15, and 16 can be also grown by continuous heating.

As has been discussed, the manufacturing method for the mounting structure according to the third embodiment includes: growing the Ni—Sn alloy layer 14 composed of a metal (nickel) constituting the protruding electrode 6 and a metal (tin) constituting the solder 9, the Sn—Cu alloy layer 15 composed of a metal (copper) constituting the cylindrical electrode 13 and the metal (tin) constituting the solder 9, and the Ni—Sn—Cu alloy layer 16 composed of the metal (nickel) constituting the protruding electrode 6, the metal (tin) constituting the solder 9, and the metal (copper) constituting the cylindrical electrode 13, by melting the solder 9 that joins the protruding electrode 6 having a curvature on the edge on the electrode terminal 4 and the cylindrical electrode 13 that is an example of a cylindrical electrode provided on the electrode terminal 5; and cooling the solder 9 so as to form the junction that connects the electrode terminal 4 and the electrode terminal 5, the junction having a cross section structure including the Ni—Sn alloy layer 14, the Sn—Cu alloy layer 15, and the Ni—Sn—Cu alloy layer 16 that are surrounded by the solder 9 having a lower modulus of elasticity than the Ni—Sn alloy layer 14, the Sn—Cu alloy layer 15, and the Ni—Sn—Cu alloy layer 16. Since the metal (copper) constituting the cylindrical electrode 13 has a lower modulus of elasticity than the metal (nickel) constituting the protruding electrode 6, the content of the metal having a lower modulus of elasticity than the metal (nickel) constituting the protruding electrode 6 is larger in the alloy layer of the junction than in the first embodiment.

According to the third embodiment, the cylindrical electrode 13 is made of the metal (Cu) having a lower modulus of elasticity than the metal (Ni) constituting the protruding electrode 6, allowing the alloy layer to contain Cu having a lower modulus of elasticity than Ni. Thus, even if a fragile low-dielectric constant insulating layer 3 immediately under the electrode terminal 4 of the semiconductor chip 1 is an extremely low-k layer that is more fragile than an ultra low-k layer, exfoliation and a crack can be prevented on the low-dielectric constant insulating layer 3, achieving the mounting structure with higher connection reliability.

Fourth Embodiment

According to a fourth embodiment, differences from the first embodiment will be described below. The same explanation as in the first embodiment is optionally omitted. The fourth embodiment is different from the first embodiment in that at a cross-sectional position having a maximum solder ratio in at least one junction disposed on the outer periphery of a semiconductor chip 1, the ratio of solder 9 is higher than that at a cross-sectional position having a maximum solder ratio in at least one junction disposed at the center of the semiconductor chip 1. The cross-sectional position having the maximum solder ratio is a cross-sectional position where the ratio of the solder 9 is maximized in the junction.

Figure 14A:
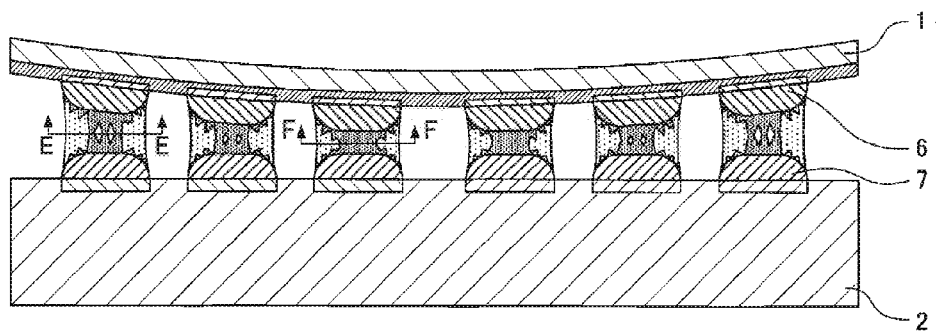
FIG. 14A is a cross-sectional view for explaining a mounting structure according to a fourth embodiment.

FIG. 14A is a cross-sectional view for explaining a mounting structure according to the fourth embodiment. In the fourth embodiment, the semiconductor chip 1 has a rectangular outside shape. As shown in FIG. 14A, the semiconductor chip 1 in the fourth embodiment is smaller in thickness and is more curved than in the first embodiment. A distance between protruding electrodes 6 on the semiconductor chip 1 and protruding electrodes 7 on a circuit board 2 increases toward the corners of the semiconductor chip 1 from the center of the semiconductor chip 1.

Figure 14B:
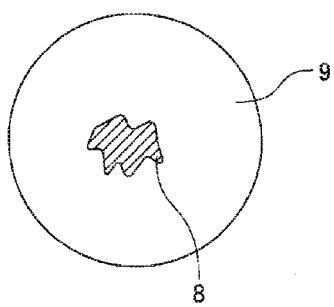
FIG. 14B is an enlarged cross-sectional view for explaining the mounting structure according to the fourth embodiment.
Figure 14C:
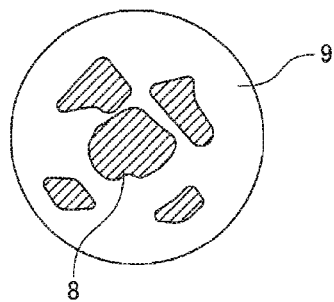
FIG. 14C is an enlarged cross-sectional view for explaining the mounting structure according to the fourth embodiment.

FIG. 14B is a cross-sectional view taken along the line E-E of FIG. 14A. FIG. 14B shows the junction cut at the cross-sectional position having the maximum solder ratio at the corner of the semiconductor chip 1 having a rectangular outside shape. FIG. 14C is a cross-sectional view taken along the line F-F of FIG. 14A. FIG. 14C shows the junction cut at the cross-sectional position having the maximum solder ratio at the center of the semiconductor chip 1 having a rectangular outside shape.

As shown in FIGS. 14B and 14C, at the cross-sectional position having the maximum solder ratio in the junction at the corner of the semiconductor chip 1, the ratio of the solder 9 is higher than that at the cross-sectional position having the maximum solder ratio in the junction disposed at the center of the semiconductor chip 1 in the mounting structure of the fourth embodiment.

In the fourth embodiment, the semiconductor chip 1 has a rectangular outside shape of 4 mm×4 mm and has a thickness of 0.05 mm. The circuit board 2 has a rectangular outside shape of 8 mm×8 mm and has a thickness of 0.5 mm. Electrode terminals 4 of the semiconductor chip 1 and electrode terminals 5 of the circuit board 2 are shaped like circles having a diameter of 25 μm and are evenly spaced in a lattice pattern with a pitch of 50 μm between the electrode terminals. The electrode terminals 4 of the semiconductor chip 1 and the electrode terminals 5 of the circuit board 2 have circular surfaces exposed with a diameter of 15 μm from an insulating film. The electrode terminals 4 and 5 are 1.0 μm in thickness.

A manufacturing method for the mounting structure according to the fourth embodiment will be described below. In the manufacturing method for the mounting structure according to the fourth embodiment, as in the first embodiment, the protruding electrodes 6 are formed on the semiconductor chip 1 and are precoated with the solder 9 into domes. Meanwhile, as in the first embodiment, the protruding electrodes 7 are formed on the circuit board 2 and are precoated with the solder 9 into domes.

After that, the semiconductor chip 1 and the circuit board 2 are first heated in, for example, an atmosphere of inert gas of $N_2$ so as to heat the solder 9 on the semiconductor chip 1 and the circuit board 2 at least to the melting point of solder (e.g., 220° C. to 260° C.) The semiconductor chip 1 is then pressed onto the circuit board 2 with the molten solder 9 on the semiconductor chip 1 and the circuit board 2. This mixes the molten solder 9 on the semiconductor chip 1 and the molten solder 9 on the circuit board 2.

In the fourth embodiment, the pressing operation is stopped so as to remove pressures against the semiconductor chip 1 and the circuit board 2. Thus, the semiconductor chip 1 is more curved than in the first embodiment. In other words, the junctions located on the outer periphery (at least at the corners) of the semiconductor chip 1 are set higher than that at the center of the semiconductor chip 1. Furthermore, the junctions located on the outer periphery (at least at the corners) of the semiconductor chip 1 are set higher than those of the first embodiment, and differences in height between the junctions located on the outer periphery (at least at the corners) of the semiconductor chip 1 and the junction located at the center of the semiconductor chip 1 are larger than those of the first embodiment. Thus, the solder 9 included in the junctions located on the outer periphery (at least at the corners) of the semiconductor chip 1 is more extended than in the first embodiment. This causes the junctions located on the outer periphery (at least at the corners) of the semiconductor chip 1 to have a smaller cross-sectional area than the junction located at the center of the semiconductor chip 1. Consequently, at the cross-sectional positions having the maximum solder ratio in the junctions located on the outer periphery (at least at the corners) of the semiconductor chip 1, the ratio of solder 9 is higher than that at the cross-sectional position having the maximum solder ratio in the junction disposed at the center of the semiconductor chip 1.

The semiconductor chip 1 and the circuit board 2 are then cooled at least to the solidifying point of solder. This solidifies the mixed solder 9 so as to form solder junctions. In other words, the solidification forms the junctions connecting the electrode terminals 4 of the semiconductor chip 1 and the electrode terminals 5 of the circuit board 2. The semiconductor chip 1 and the circuit board 2 are then cooled at least to room temperature, achieving the mounting structure.

In the manufacturing method for the mounting structure according to the fourth embodiment, pressures against the semiconductor chip 1 and the circuit board 2 are reduced in the step of melting the solder 9 such that at the cross-sectional position having the maximum solder ratio in the at least one junction disposed on the outer periphery of the semiconductor chip 1, the ratio of the solder 9 is higher than that at the cross-sectional position having the maximum solder ratio in the at least one junction disposed at the center of the semiconductor chip 1.

According to the fourth embodiment, in the junctions located on the outer periphery (at least at the corners) of the semiconductor chip 1, the content of Sn having a low modulus of elasticity is higher than that of the first embodiment. Thus, on the outer periphery (at least at the corners) of the semiconductor chip 1, a tensile stress applied to the electrode terminals 4 of the semiconductor chip 1 can be smaller than in the first embodiment. This can further suppress exfoliation and a crack on a fragile low-dielectric constant insulating layer 3 immediately under the electrode terminals 4 located at the corners of the semiconductor chip 1, though a tensile stress applied to the layer immediately under the electrode terminals 4 of the semiconductor chip 1 is maximized at the corners of the semiconductor chip 1 by thermal expansion and vibrations.

If the manufacturing method of the fourth embodiment is used for the mounting structure of the second embodiment, the ratio of the solder 9 can be higher than in the second embodiment at the cross-sectional positions having the maximum solder ratio in the junctions disposed on the outer periphery (at least at the corners of the semiconductor chip 1 if the semiconductor chip 1 has a rectangular outside shape) of the semiconductor chip 1. Similarly, if the manufacturing method of the fourth embodiment is used for the mounting structure of the third embodiment, the ratio of the solder 9 can be higher than in the third embodiment at the cross-sectional positions having the maximum solder ratio in the junctions disposed on the outer periphery (at least at the corners of the semiconductor chip 1 if the semiconductor chip 1 has a rectangular outside shape) of the semiconductor chip 1.

Fifth Embodiment

According to a fifth embodiment, differences from the first embodiment will be described below. The same explanation as in the first embodiment is optionally omitted. The fifth embodiment is different from the first embodiment in that in a junction having a larger current value than other junctions per unit time, the content of solder 9 is smaller than those in the other junctions. Thus, an alloy layer 8 is more grown and stabilized than in the first embodiment, the alloy layer 8 being fed with a large current in the actual use of a semiconductor device including a mounting structure according to the fifth embodiment.

Figure 15A:
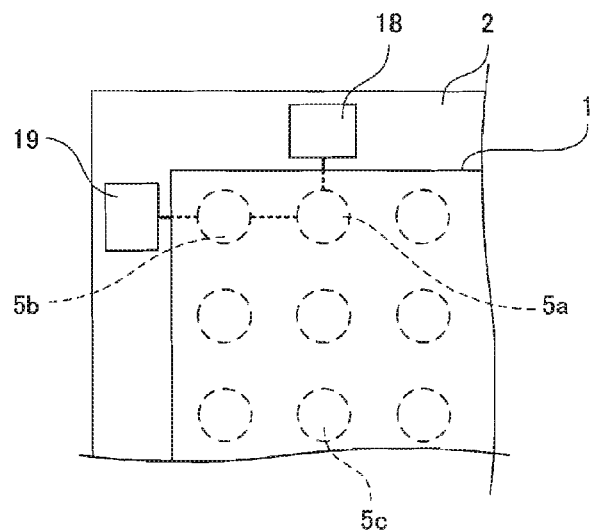
FIG. 15A is a plan view for explaining a mounting structure according to a fifth embodiment.

FIG. 15A is a plan view for explaining the mounting structure according to the fifth embodiment. As shown in FIG. 15A, large-current carrying pads 18 and 19 electrically connected to a power supply or the like are disposed around a region containing electrode terminals on a surface of a circuit board 2 containing the electrode terminals 5. The large-current carrying pads 18 and 19 are electrically connected to predetermined electrode terminals 5a and 5b of the electrode terminals 5 of the circuit board 2 via wires. In the fifth embodiment, the large-current carrying pads 18 and 19 are electrically connected to the electrode terminals 5a and 5b facing two electrode terminals 4 disposed at the corners of a semiconductor chip 1 having a rectangular outside shape.

Figure 15B:
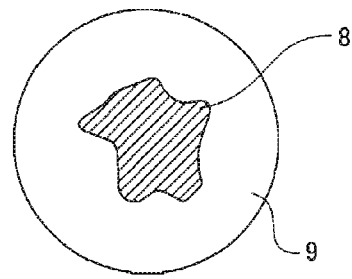
FIG. 15B is an enlarged cross-sectional view for explaining the mounting structure according to the fifth embodiment.
Figure 15C:
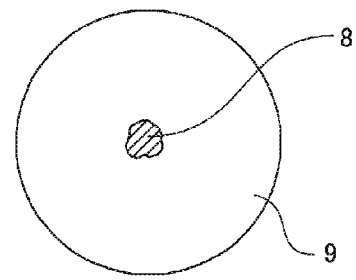
FIG. 15C is an enlarged cross-sectional view for explaining the mounting structure according to the fifth embodiment.
Figure 16:
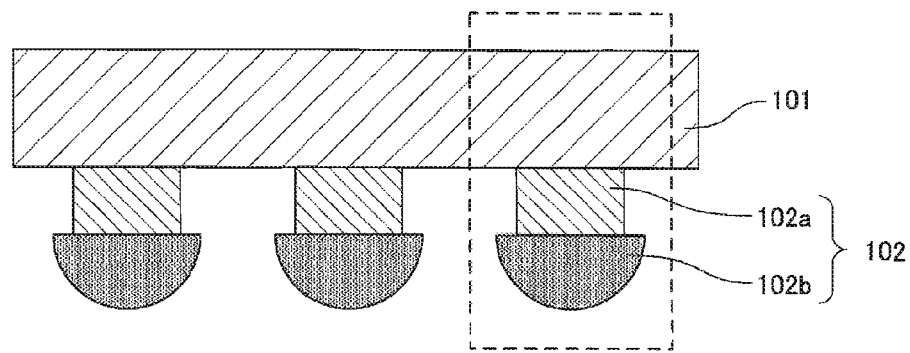
FIG. 16 is a cross-sectional view for explaining a conventional mounting structure.
Figure 16:
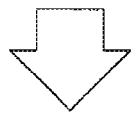
Figure 16:
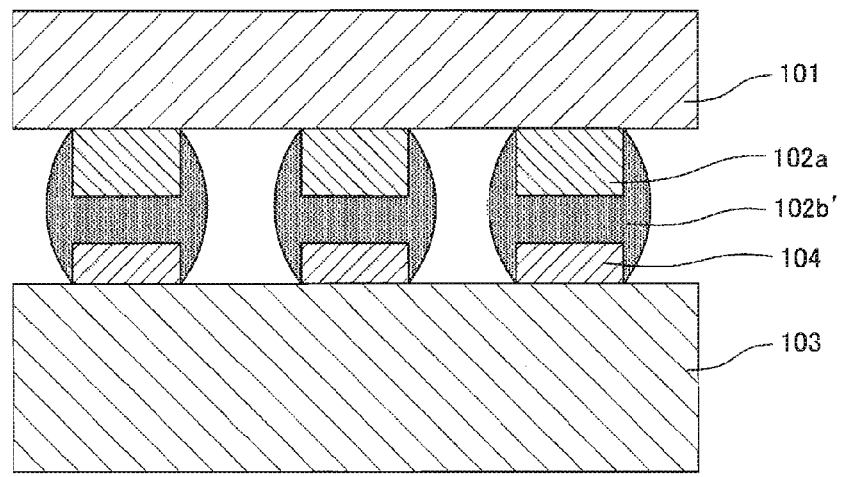

FIG. 15B is a cross-sectional view of the junction on the electrode terminal 5a electrically connected to the large-current carrying pad 18. The junction is cut along a plane located between a protruding electrode 6 on the semiconductor chip 1 and a protruding electrode 7 on the circuit board 2. FIG. 15C is a cross-sectional view of the junction on an electrode terminal 5c that is disposed near the electrode terminal 5a electrically connected to the large-current carrying pad 18 without being electrically connected to the large-current carrying pad 18 or 19. The junction is cut along the plane located between the protruding electrode 6 on the semiconductor chip 1 and the protruding electrode 7 on the circuit board 2. In other words, the electrode terminal 5c also faces the electrode terminal 4 at the corner of the semiconductor chip 1, out of the electrode terminals 4 of the semiconductor chip 1 having a rectangular outside shape. However, a large current is not applied to the electrode terminal 5c.

As shown in FIGS. 15B and 15C, even in the case of the electrode terminals 5a and 5c are located close to each other, the alloy layer 8 in the junction on the electrode terminal 5a electrically connected to the large-current carrying pad 18 has a larger cross-sectional area than the alloy layer 8 in the junction on the electrode terminal 5c electrically unconnected to the large-current carrying pads 18 and 19. In other words, the alloy layer 8 in the junction on the electrode terminal 5a electrically connected to the large-current carrying pad 18 is more grown and stabilized than the alloy layer 8 in the junction on the electrode terminal 5c electrically unconnected to the large-current carrying pads 18 and 19.

A manufacturing method for the mounting structure according to the fifth embodiment will be described below. The manufacturing method according to the fifth embodiment is different from the first embodiment in the step of further growing the alloy layer 8 in the junction by applying a large current only to the junction after the step of mounting the semiconductor chip 1 on the circuit board 2, the large current being applied to the junction in the actual use of the semiconductor device including the mounting structure according to the fifth embodiment. Specifically, the manufacturing method according to the fifth embodiment includes the step of applying a current only to the large-current carrying pads 18 and 19 so as to accelerate the growth of the alloy layer 8 in the junctions on the electrode terminals 5a and 5b of the circuit board 2 after the step of mounting the semiconductor chip 1 on the circuit board 2.

The fifth embodiment suppresses the migration of Ni atoms contained in the protruding electrodes 6 and 7 on the electrode terminals 5a and 5b of the circuit board 2 and Sn atoms contained in the solder 9 on the electrode terminals 5a and 5b of the circuit board 2 in the actual use of the semiconductor device, the migration being caused by an electromigration phenomenon. This suppresses the growth of the alloy layer 8. In other words, the alloy layer 8 is stabilized on the electrode terminals 5a and 5b that receive a large current in the actual use of the semiconductor device. Thus, the mounting structure can be obtained with more stable connection reliability.

If the manufacturing method of the fifth embodiment is used for the mounting structures of the second to fourth embodiments, the alloy layer can be grown and stabilized in the junction that receives a large current in the actual use of the semiconductor device.

INDUSTRIAL APPLICABILITY

The present invention is particularly useful for the field of mounting, on a circuit board, a semiconductor chip having electrode terminals with smaller pitches or a semiconductor chip having an interlayer insulating film made of a low-dielectric constant material.

The invention claimed is:

1. A mounting structure comprising:
   an electronic component having a plurality of first electrode terminals;
   a substrate having a plurality of second electrode terminals; and
   a plurality of junctions, each of which contains an alloy and a metal, the metal having a lower modulus of elasticity than the alloy, each of the junctions connecting a respective one of the first electrode terminals to a respective one of the second electrode terminals,
   wherein each of the plurality of junctions has a cross section structure containing a plurality of cross sections that are parallel to a plane of the substrate, and including the alloy that is surrounded by the metal having the lower modulus of elasticity,
   a first maximum proportion of the metal in any of the plurality of cross sections for a first one of the plurality of junctions disposed toward an outer periphery relative to the electronic component is greater than a second maximum proportion of the metal in any one of the plurality of cross sections for a second one of the plurality of the junctions disposed toward a center relative to the electronic component, and the electronic component is curved, and
   a first thickness of the first one of the plurality of the junctions is greater than a second thickness of the second one of the plurality of the junctions, the first and second thickness being perpendicular to the plane of the substrate.

2. The mounting structure according to claim 1, wherein at least one junction among the plurality of junctions has a portion connecting an alloy grown from the first electrode terminal and an alloy grown from the second electrode terminal, and the connecting portion contains an alloy surrounded by the metal having the lower modulus of elasticity.

3. The mounting structure according to claim 1, wherein the plurality of junctions include a first junction and a second junction, and if the first junction has a current value larger than a current value of the second junction per unit time, a content of the metal having the lower modulus of elasticity in the first junction is smaller than a content of the metal having the lower modulus of elasticity in the second junction.

4. The mounting structure according to claim 1, wherein the plurality of junctions include a first protruding electrode that is provided on the first electrode terminal of the electronic component and has a curvature on an edge of the first protruding electrode.

5. The mounting structure according to claim 4, wherein the plurality of junctions further include a second protruding electrode that is provided on the second electrode terminal of the substrate and has a curvature on an edge of the second protruding electrode.

6. The mounting structure according to claim 5, wherein the metal having the lower modulus of elasticity is solder.

7. The mounting structure according to claim 4, wherein the junction further contains a flat electrode provided on the second electrode terminal of the substrate.

8. The mounting structure according to claim 7, wherein the metal having the lower modulus of elasticity is solder.

9. The mounting structure according to claim 4, wherein the plurality of junctions further include a cylindrical electrode provided on the second electrode terminal of the substrate.

10. The mounting structure according to claim 9, wherein the metal having the lower modulus of elasticity is solder.

11. The mounting structure according to claim 1, wherein the alloy contains a nickel-tin alloy, and the metal having the lower modulus of elasticity contains tin.

12. The mounting structure according to claim 4, wherein the first protruding electrode contains nickel, the alloy contains a nickel-tin alloy, and the metal having the lower modulus of elasticity contains tin.

13. The mounting structure according to claim 5, wherein the first protruding electrode contains nickel, the second protruding electrode contains nickel, the alloy contains a nickel-tin alloy, and the metal having the lower modulus of elasticity contains tin.

14. The mounting structure according to claim 7, wherein the first protruding electrode contains nickel, the flat electrode contains nickel, the alloy contains a nickel-tin alloy, and the metal having the lower modulus of elasticity contains tin.

15. The mounting structure according to claim 9, wherein the first protruding electrode contains nickel, the cylindrical electrode contains copper, the alloy contains a nickel-tin alloy, a tin-copper alloy, and a nickel-tin-copper alloy, and the metal having the lower modulus of elasticity contains tin.

16. The mounting structure according to claim 1, wherein the alloy has fine irregularities on a surface of the alloy.

* * * * *